(12) United States Patent
Huang et al.

(10) Patent No.: US 9,918,420 B2
(45) Date of Patent: Mar. 13, 2018

(54) APPARATUS AND METHOD OF BATCH ASSEMBLY

(71) Applicant: IMEC Taiwan CO., Hsinchu (TW)

(72) Inventors: Kevin Huang, Taipei (TW); Chihchung (Gary) Chen, Zhubei (TW); Wei-Lun Sung, Hsinchu (TW)

(73) Assignee: IMEC TAIWAN CO., Hsinchu (TW)

( * ) Notice: Subject to any disclaimer, the term of this patent is extended or adjusted under 35 U.S.C. 154(b) by 454 days.

(21) Appl. No.: 13/776,235

(22) Filed: Feb. 25, 2013

(65) Prior Publication Data

US 2014/0241845 A1   Aug. 28, 2014

(51) Int. Cl.
*H05K 13/04* (2006.01)

(52) U.S. Cl.
CPC .................. *H05K 13/0478* (2013.01)

(58) Field of Classification Search
CPC ................ B25J 15/0052; B25J 15/0061; B25J 15/0095; B25J 19/0016; H01L 21/561; H01L 21/67369; H01L 21/68771; H05K 13/0452; H05K 13/046; H05K 13/0465; H05K 13/0469; H05K 13/0482; B65B 21/04; B65B 21/20; B66C 1/0243
USPC ....... 414/751.1; 438/67, 107, 110, 117, 406, 438/455; 294/65, 87.1, 87.12
See application file for complete search history.

(56) References Cited

U.S. PATENT DOCUMENTS

| | | | | |
|---|---|---|---|---|
| 1,427,817 | A * | 9/1922 | Hutchinson | G01N 27/205 209/523 |
| 5,899,341 | A * | 5/1999 | Irita | 209/571 |
| 2008/0297140 | A1* | 12/2008 | An | G01R 31/2893 324/757.01 |
| 2013/0068022 | A1* | 3/2013 | Jeung | G01C 19/56 73/514.29 |

FOREIGN PATENT DOCUMENTS

| | | | | |
|---|---|---|---|---|
| DE | 2428517 A1 * | 1/1975 | | B65B 21/20 |
| GB | 1462677 | 1/1977 | | |

OTHER PUBLICATIONS

ASTM C225-85, Published 2014.*

* cited by examiner

*Primary Examiner* — Anna M Momper
*Assistant Examiner* — Brendan P Tighe
(74) *Attorney, Agent, or Firm* — McDonnell Boehnen Hulbert & Berghoff LLP

(57) ABSTRACT

The present disclosure is directed to an apparatus and method of batch assembly. The apparatus for batch assembly may include a plurality of spring units, a plurality of handling units, and a control unit. The method of batch assembly may include aligning an array of devices with a plurality of handling units, attaching the array of devices onto the handling units, expanding the handling units so as to expand the array of devices from a first area to a second area, and transferring the array of devices to a destination.

32 Claims, 23 Drawing Sheets

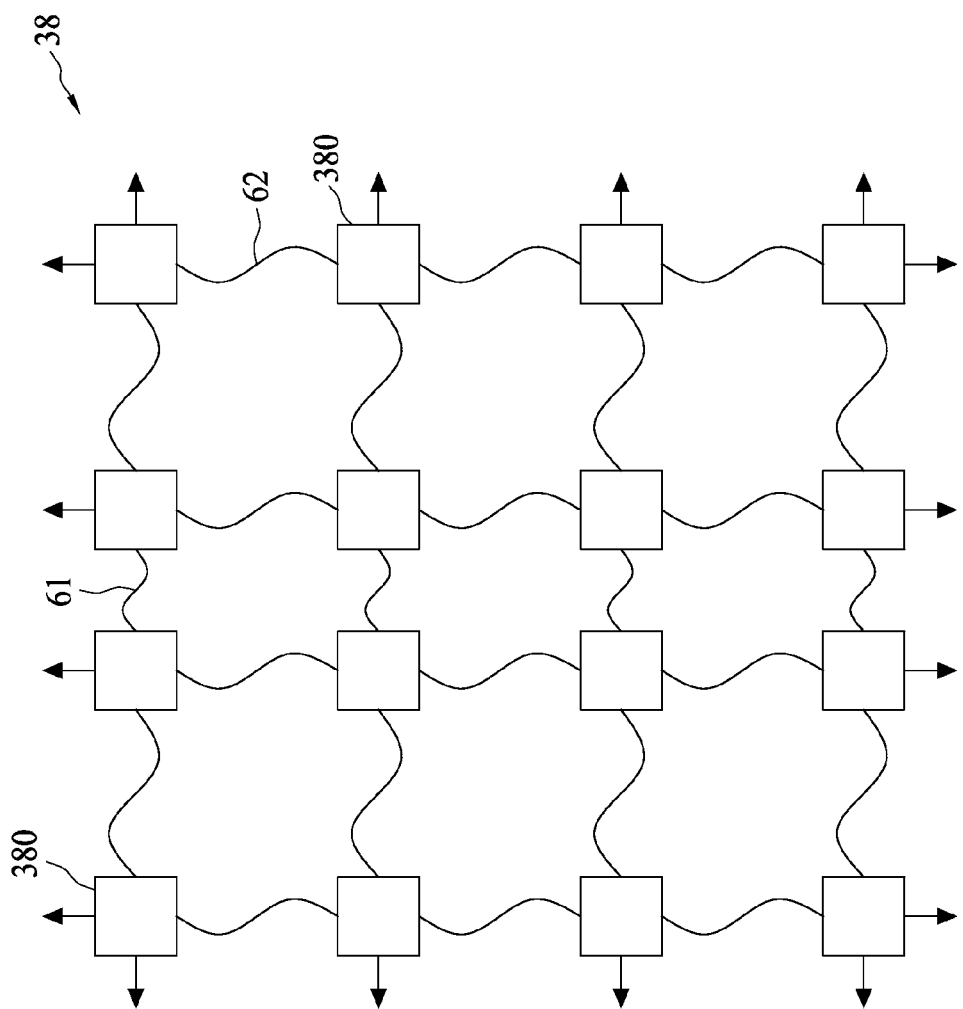

APPARATUS AND METHOD OF BATCH ASSEMBLY

BACKGROUND

1. Technical Field

The present disclosure generally relates to device assembly and, more particularly, to an apparatus and method of device assembly in batch.

2. Related Art

Surface mount technology (SMT) component placement systems, commonly called pick-and-place machines or P&Ps, are robotic machines to place surface-mount devices (SMDs) onto a printed circuit board (PCB). Pick-and-place machines are used for high precision placing of a broad range of electronic components. However, pick-and-place may be disadvantageous in its time-consuming process and costly machinery.

A plastic diaphragm, such as blue tape and UV tape, is a method of packaging electronic components. Plastic diaphragms may still involve a time-consuming process to individually pick-and-place. Moreover, plastic diaphragms may suffer high stress, limited expanding mode, and one-time-use material. Specifically, high stress induced by an expanded diaphragm may damage sensitive device wafers or ultra-thin wafers. Limited expanding modes may result in undesirable positioning for asymmetric diaphragms. Furthermore, it is difficult to control inhomogeneous expanding for various device density requirements in a same wafer.

A mechanical spreader is a re-usable apparatus for batch-type die transferring. Each gripper of the mechanical spreader positions devices with an elastically variable pitch screw. However, there is a manufacturing limit for handling devices with ultra-fine pitches due to complex mechanism assembly. There are also accuracy and reliability issues with the mechanical spreaders due to, for example, rubber wearing and assembly tolerance.

SUMMARY

Embodiments of the present disclosure may provide an apparatus for batch assembly. In one example, the apparatus includes a plurality of handling units for holding devices, and a plurality of spring units connected to the plurality of handling units.

In one embodiment, at least one of the spring units is connected between adjacent handling units. In another embodiment, at least one of the spring units is connected to two handling units separated by at least one handling unit.

In yet another embodiment, the apparatus further includes at least one motion controller to control the movement of the handling units. Moreover, one of the at least one motion controller has a curved surface.

In still another embodiment, the spring units are arranged in columns, wherein at least one of the columns includes spring units of different lengths. Furthermore, a first one of the columns extends in a first direction, and a second one of the columns extends in a second direction transverse to the first direction.

In yet still another embodiment, the handling units include first sections connected to the spring units, and second sections including a gripping zone for holding the devices. Moreover, the spring units are arranged in a first direction, the first sections extend in a second direction, and the second sections are tapered from the first sections towards the gripping zone.

The apparatus may further include an anchor and a lead, wherein the lead is movable with respect to the anchor.

The apparatus may also include stabilizing elements between the handling units.

In a further embodiment, the apparatus may include at least one positioning mechanism including a multi-step structure. The multi-step structure may further include a flight of steps ascending in one direction, and the handling units may include sections conformal to the multi-step structure.

In a still further embodiment, the spring units are arranged in a first layer at a first side of the handling units, and the apparatus may further include spring units arranged in a second layer at a second side of the handling units, the first layer and the second layer being arranged in a stack.

Some embodiments of the present disclosure may also provide an apparatus for batch assembly. The apparatus may comprise at least one positioning mechanism including a multi-step structure, and a plurality of handling units for holding devices, the handling units being configured in length to match the at least one positioning mechanism.

In one embodiment, the handling units include first sections to match the at least one positioning mechanism, and second sections including a gripping zone for holding the devices.

In another embodiment, the multi-step structure includes a flight of steps ascending in a direction, and the first sections of the handling units descend in the direction.

In yet another embodiment, the apparatus further includes a plurality of spring units connected to the handling units.

In still another embodiment, the handling units include a gripping zone for holding the devices, and include discrete portions connected by the spring units at the gripping zone.

In yet still another embodiment, the apparatus further includes a control unit having at least one motion controller to control the movement of the handling units.

In a further embodiment, the apparatus further includes a plurality of spring units connected to the handling units, wherein at least one of the control unit, the plurality of handling units, or the plurality of spring units is configured to test the devices.

In a still further embodiment, the apparatus further includes stabilizing elements between the handling units.

Embodiments of the present disclosure may further provide a method of batch assembly. The method may include aligning an array of devices with a plurality of handling units of a first expanding tool, attaching the array of devices onto the handling units, expanding the handling units to expand the array of devices from a first area to a second area, and transferring the array of devices to a destination.

In one embodiment, the method further includes removing the array of devices from the handling units, rotating the array of devices at an angle, attaching the array of devices onto the handling units, and expanding the handling units to expand the array of devices from the second area to a third area.

In another embodiment, the step of expanding includes expanding the handling units in a first direction, and the method further includes providing a second expanding tool, removing the array of devices from the handling units of the first expanding tool, attaching the array of devices onto handling units of the second expanding tool, and expanding the array of devices in a second direction.

In yet another embodiment, the step of expanding further includes expanding the handling units on a curved surface.

Some embodiments of the present disclosure may also provide a method of batch assembly. The method includes providing at least one positioning mechanism including a multi-step structure, aligning an array of devices with a plurality of handling units of an expanding tool, wherein the handling units are configured in length to match the at least one positioning mechanism, attaching the array of devices onto the handling units, and expanding the handling units to expand the array of devices.

In one embodiment, the expanding step includes at least one of flipping or tilting the handling units.

The foregoing has outlined rather broadly the features and technical advantages of the present disclosure in order that the detailed description that follows may be better understood. Additional features and advantages of the disclosure will be described hereinafter, and form the subject of the claims. It should be appreciated by those skilled in the art that the conception and specific embodiments disclosed might be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

The objectives and advantages of the present disclosure will become apparent upon reading the following description and upon reference to the accompanying drawings in which:

FIG. 6D is a schematic diagram illustrating an expanded state of handling units according to an embodiment of the present disclosure;

DESCRIPTION OF THE EMBODIMENTS

Figure 1:
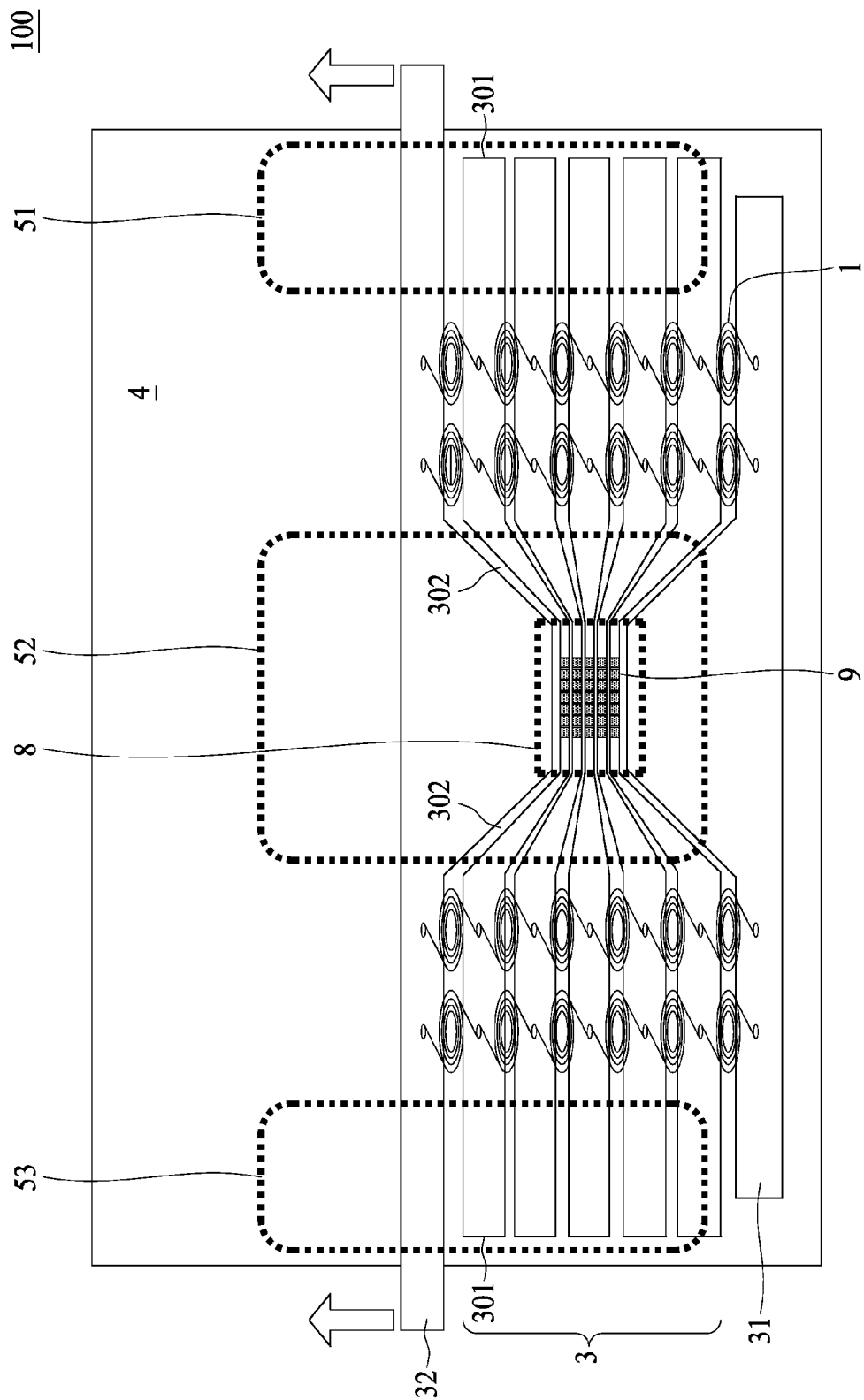
FIG. 1 is a schematic top view illustrating an apparatus for batch assembly according to an embodiment of the present disclosure.

FIG. 1 is a schematic top view of an apparatus 100 for batch assembly according to an embodiment of the present disclosure. Referring to FIG. 1, the apparatus 100 may include a plurality of spring units 1, a plurality of handling units 3 and a control unit 4. The spring units 1 are disposed between and physically and/or electrically connected to the handling units 3. Each of the spring units 1 may include a compliable element or micro spring that is expandable or compressible in response to a controlled force. Illustrative materials for the compliable element or micro spring may include crystalline silicon (C—Si), poly silicon, amorphous silicon, piezoelectric material, magnetic material, light-emitting material, transducer material, metal, dielectric, polydimethylsiloxane (PDMS), polymers, alloys, hybrid materials, materials grown by self-assembly, direct growth techniques, CVD fabrication, PVD fabrication, thermally grown or epitaxially grown materials or a combination thereof. For example, the compliable element or micro spring may include metal on dielectric or silicon or nickel cobalt (NiCo) coated with gold.

In the present embodiment, the spring units 1 are arranged in columns and each column of spring units 1 may extend in a first direction. Moreover, some of the spring units 1 may each be connected to adjacent handling units 3.

The handling units 3 may each include first sections 301 connected to spring units 1, and second sections 302 to hold devices 9. The first sections 301 may extend in a second direction, which may be but is not limited to be substantially orthogonal to the first direction. The second sections 302 may be tapered from the first sections 301 to a gripping zone 8 where an array of devices 9 may be held. In the present embodiment, the handling units 3 have a symmetric structure with the gripping zone 8 located at a center region. Moreover, the handling units 3 are separated from one another. Furthermore, the handling units 3, and hence the devices 9 held at the gripping zone 8 of the handling units 3, may move in the first direction as the spring units 1 connected thereto are expanded or compressed in the first direction.

Materials of the handling units 3 may include but are not limited to glass, plastic, metal, and ceramic. In one embodiment, the handling units 3 are optically transparent to facilitate alignment of the devices 9.

In one embodiment, the devices 9 may include at least one of silicon-compatible semiconductor components or non-silicon components. Examples of the silicon-compatible components may include but are not limited to processor chips, complementary metal-on-oxide (CMOS) devices, micro electromechanical systems (MEMS), solar cells, transducers such as those of piezoelectric materials, silicon-based light emitting diodes (LEDs), piezoresistive sensors, capacitive sensors, chemical vapor deposition (CVD) fabricated devices, physical vapor deposition (PVD) fabricated devices, thermally grown devices and epitaxially grown devices. Examples of the non-silicon components may include but are not limited to sapphire based LEDs and PZT (lead zirconate titanate). Moreover, the devices 9 may also include other components that offer visual, audio, tactile input/output interface, energy harvesting, transducers such as those for sensing and actuation, data processing and wireless communication.

The handling units 3 may further include an anchor 31, which is secured to the control unit 4, and a lead 32, which may guide the handling units 3 and hence the devices 9 to a desired location. Moreover, each of the anchor 31 and lead 32 is connected to one of the handling units 3 via spring units 1.

The apparatus 100 may further include at least one motion controller to facilitate the movement of the handling units 3. In the present embodiment, the at least one motion controller includes a first motion controller 51, a second motion controller 52 and a third motion controller 53, which may function under the control of the control unit 4. The first motion controller 51 and the third motion controller 53 are configured to control periphery regions of the handling units 3, while the second motion controller 52 is configured to control the gripping zone 8. Moreover, the first motion controller 51, the second motion controller 52 and the third motion controller 53 can temporarily fix the spring units 1 after expanding, and may help resist disturbance during device deployment. Furthermore, the first motion controller 51, the second motion controller 52, and the third motion controller 53 may achieve their functions by, for example, magnetic force, adhesive, electrostatic, Van der Waal's force, vacuum, surface treatment, and surface tension. In one embodiment, the first motion controller 51, the second motion controller 52, and the third motion controller 53 may provide a force to lift up at least one of the spring units 1 or the handling units 3 during device deployment so as to alleviate friction. Such force may be implemented by, for example, air purge, magnetic force, and electrostatic force.

Figure 2:
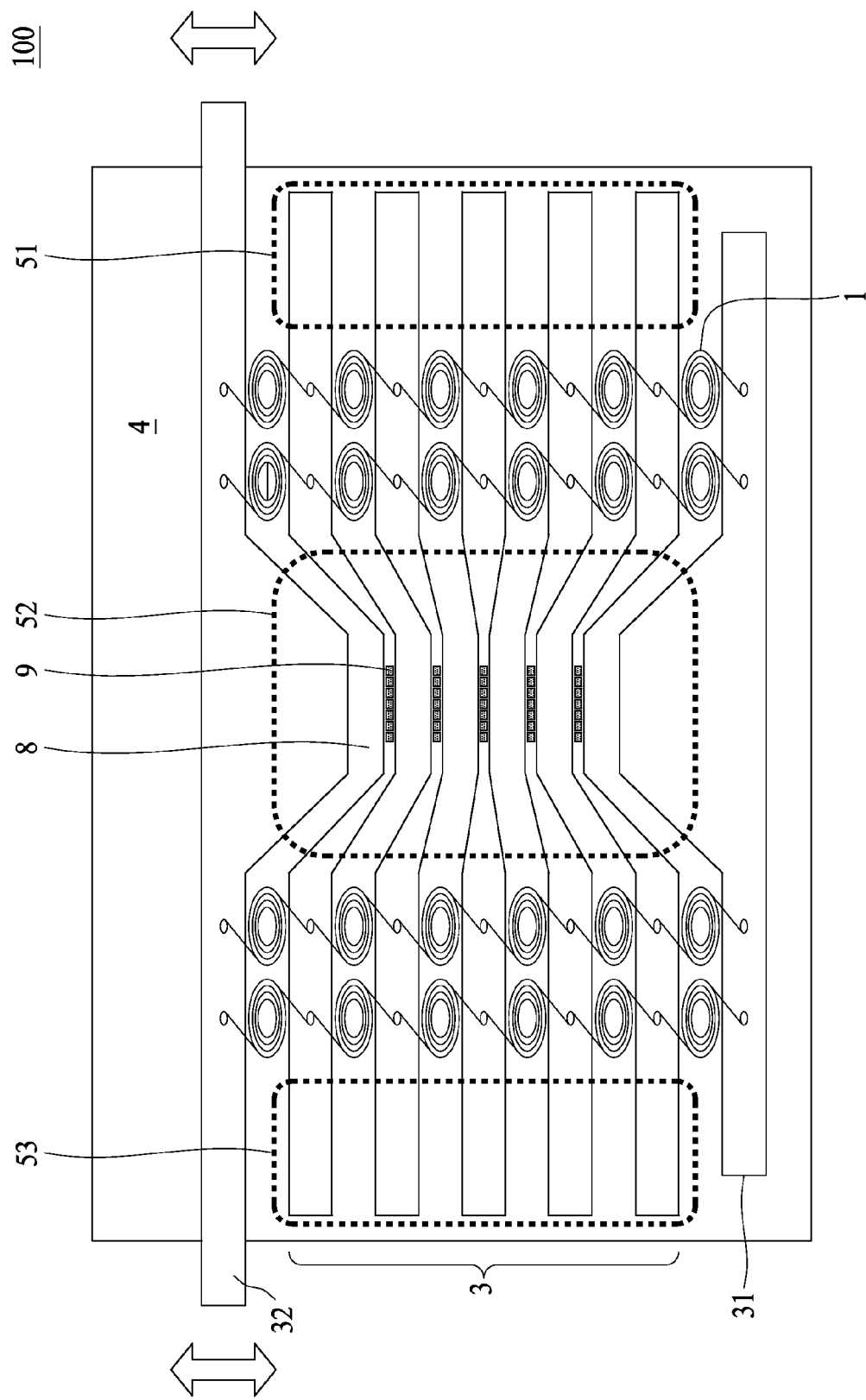
FIG. 2 is a schematic top view illustrating a method of batch assembly using the apparatus illustrated in FIG. 1 according to an embodiment of the present disclosure.

FIG. 2 is a schematic top view illustrating a method of batch assembly using the apparatus 100 illustrated in FIG. 1 according to an embodiment of the present disclosure. Referring to FIG. 2, the lead 32 moves with respect to the anchor 31 to an upper position in the first direction. Accordingly, the handling units 3 and the spring units 1 also move with respect to the anchor 31 in the first direction, under the control of the first motion controller 51 and the third motion controller 53 responsible for the peripheral regions and the second motion controller 52 responsible for the gripping zone 8. Consequently, the array of devices 9 at the gripping zone 8 are expanded in the first direction. Specifically, the devices 9 are thereby transferred from a first location at an initial or unexpanded state as shown in FIG. 1 to a second location at an expanded or half-expanded state as shown in FIG. 2.

Figure 3:
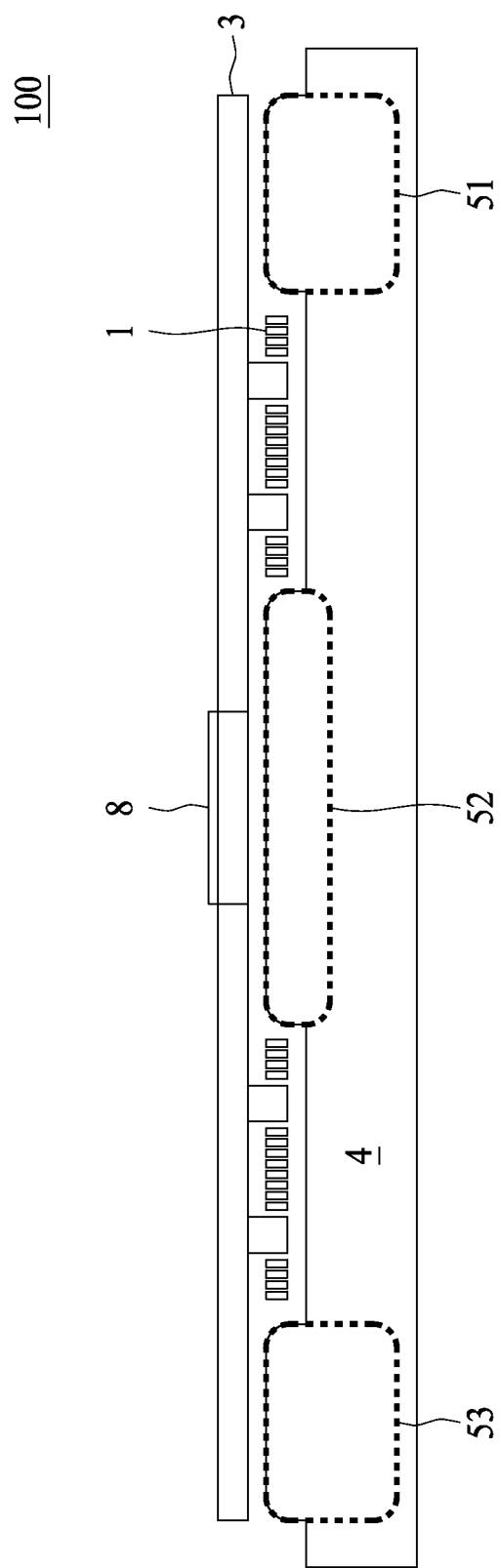
FIG. 3 is a schematic cross-sectional view illustrating the apparatus illustrated in FIG. 1.

FIG. 3 is a schematic cross-sectional view of the apparatus 100 illustrated in FIG. 1. Referring to FIG. 3, the spring units 1 may be arranged in a layer on a surface of the handling units 3 between the control unit 4 and the handling units 3. The control unit 4, such as a chuck platform, may incorporate at least one of the first motion controller 51, the second motion controller 52, or the third motion controller 53. The control unit 4 may provide electrical and/or mechanical and/or chemical functions. In one embodiment, the control unit 4 may be provided with a testing function to test the array of devices 9. For example, the control unit 4 may include circuits for testing the array of devices 9, or serve as an interface with automatic testing equipment (ATE) to facilitate device testing. In another embodiment, the handling units 3 may be provided with a testing function or configured to test the array of devices 9. In still another embodiment, the spring units 1 may integrate electrical and/or mechanical and/or chemical functions such as circuits for device testing, and interface with ATE.

Figure 4:
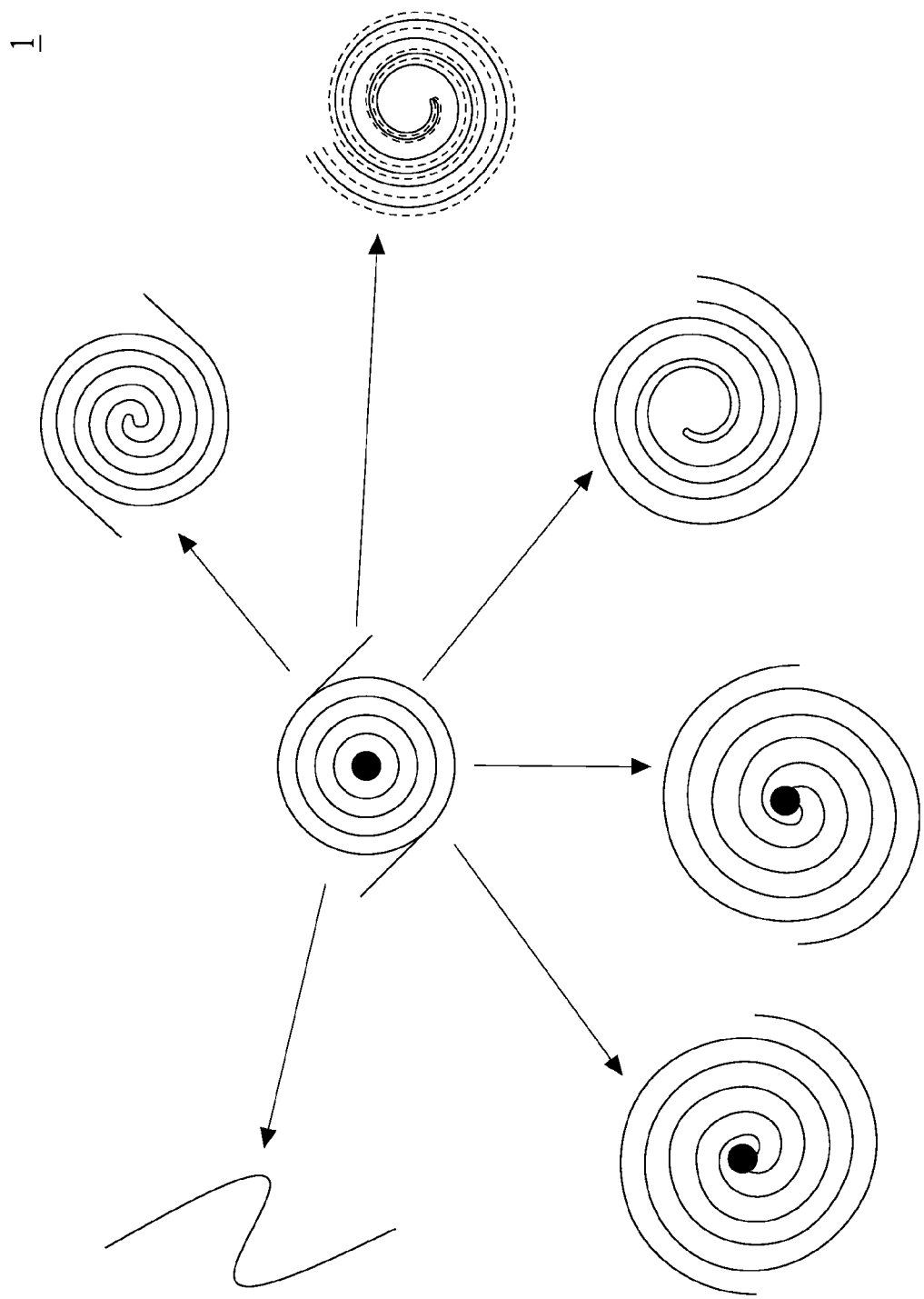
FIG. 4 is a set of schematic diagrams illustrating a spring unit according to embodiments of the present disclosure.

FIG. 4 is a set of schematic diagrams illustrating the spring unit 1 according to embodiments of the present disclosure. Referring to FIG. 4, the spring unit 1, represented by concentric circles, may take the form of a spiral shape with two or more ends to connect with handling units 3 or other spring units 1. In one embodiment, some of the spring units 1 may include different sets of compliant elements or micro springs intertwined with each other. In another embodiment, some of the spring units 1 may include a single set of compliant elements or micro springs arranged in a spiral shape. In yet another embodiment, some of the spring units 1 may include a node at the center. In still another embodiment, the spring units 1 may be configured with different lengths. In addition, the spring units 1 may be configured to provide electrical and/or mechanical and/or chemical functions, or facilitate device testing.

Figure 5A:
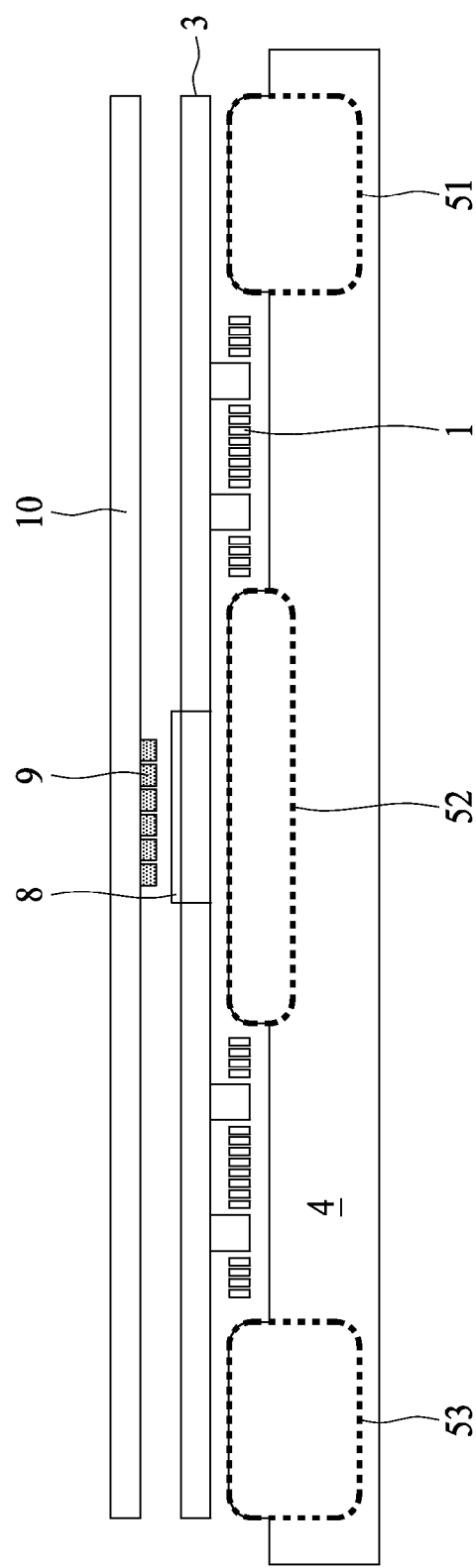
FIGS. 5A to 5D are diagrams illustrating a method of batch assembly according to another embodiment of the present disclosure.

FIGS. 5A to 5D are diagrams illustrating a method of batch assembly according to another embodiment of the present disclosure. Referring to FIG. 5A, the handling units 3 are temporarily fixed by the first motion controller 51, the second motion controller 52 and the third motion controller 53. An array of devices 9, adhered to a temporary substrate/tape 10, are aligned with the gripping zone 8 of the handling units 3. The spring units 1 are temporarily fixed on the control unit 4 by, for example, magnetic force, Van der Waals's force, electro static force, vacuum, surface treatment, or surface tension.

Figure 5B:
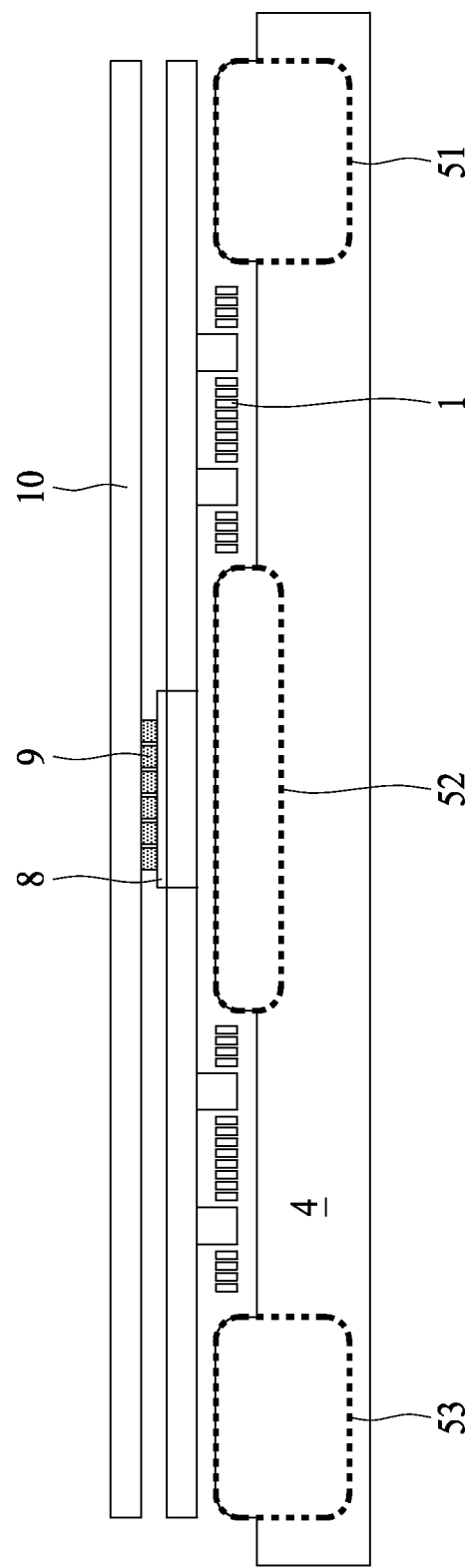

Referring to FIG. 5B, the array of devices 9 are attached onto the gripping zone 8 of the handling units 3 by, for example, magnetic force, Van der Waals's force, electro static force, vacuum, surface treatment, or surface tension. Afterwards, the temporary substrate/tape 10 is removed.

Figure 5C:
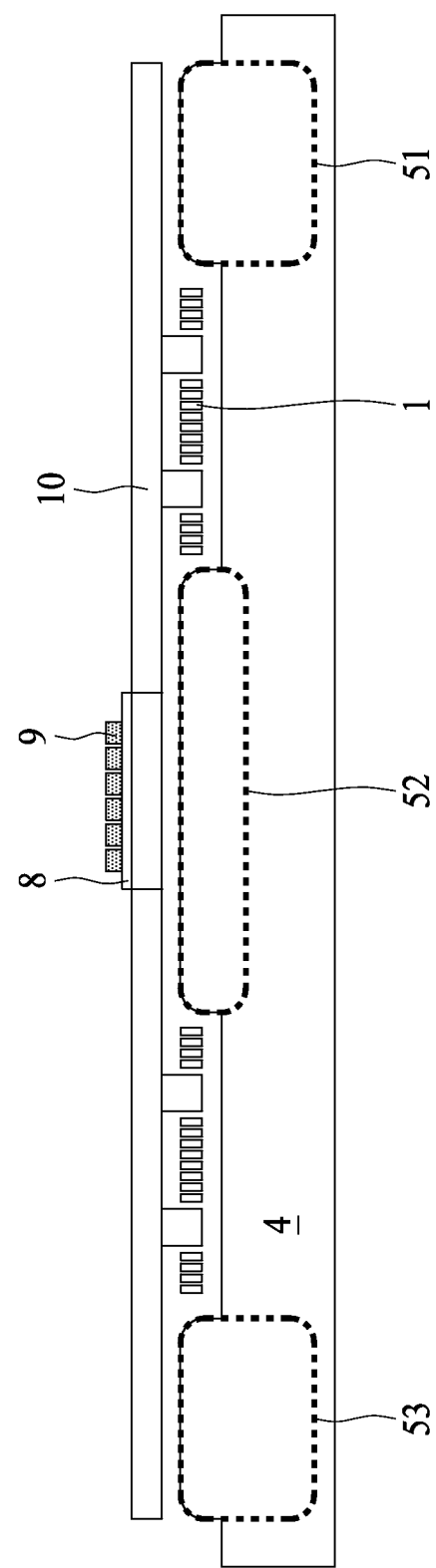

Referring to FIG. 5C, the spring units 1 and the handling units 3 are released from the temporarily fixed state. Later, the handling units 3 are lifted or floated by the first motion controller 51, the second motion controller 52, and the third motion controller 53 by, for example, air purge or magnetic force, so as to reduce the friction between the handling units 3 and the motion controllers 51 to 53.

Next, the lead 32 may be pulled to expand the spring units 3 by the first motion controller 51, the second motion controller 52 and the third motion controller 53. As a result, the array of devices 9 are moved to a predetermined area. After expanding, the handling units 3 are fixed again.

Figure 5D:
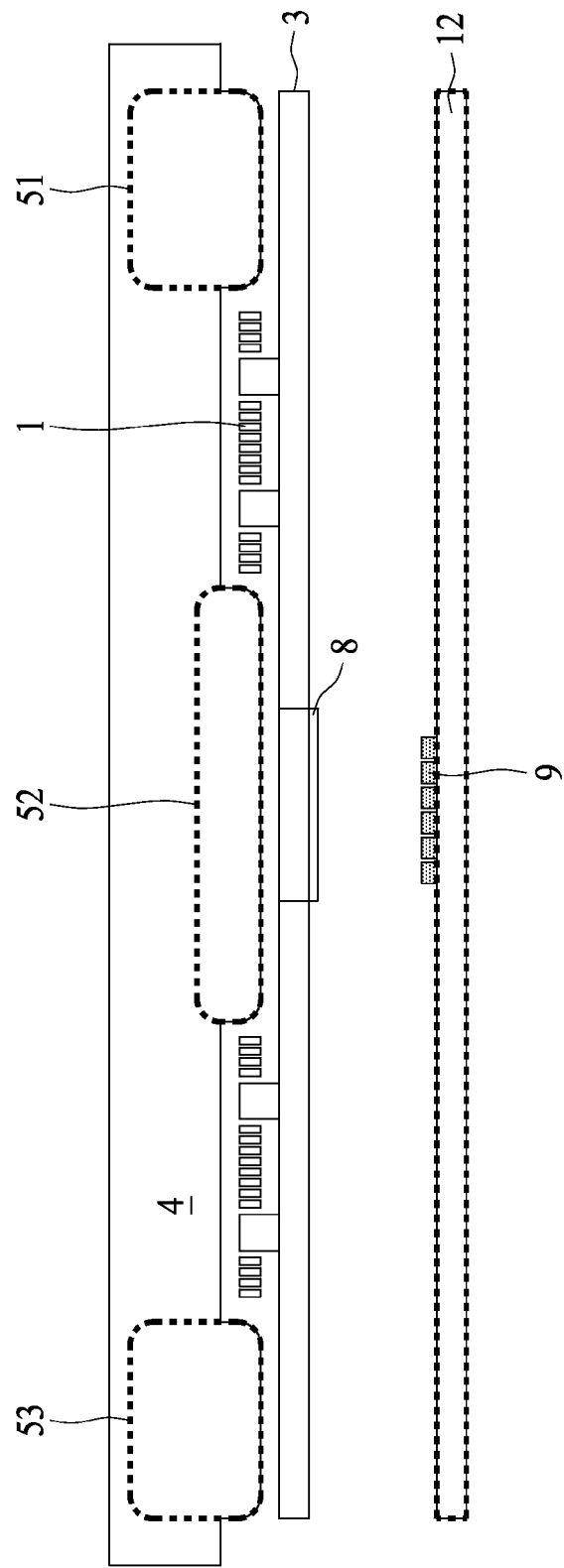

Referring to FIG. 5D, the array of devices 9 are released from the handling units 3. Subsequently, the array of devices 9 may be transferred to a destination 12 such as a substrate, other handling units, mechanism, tape, or housing.

Figure 6A:
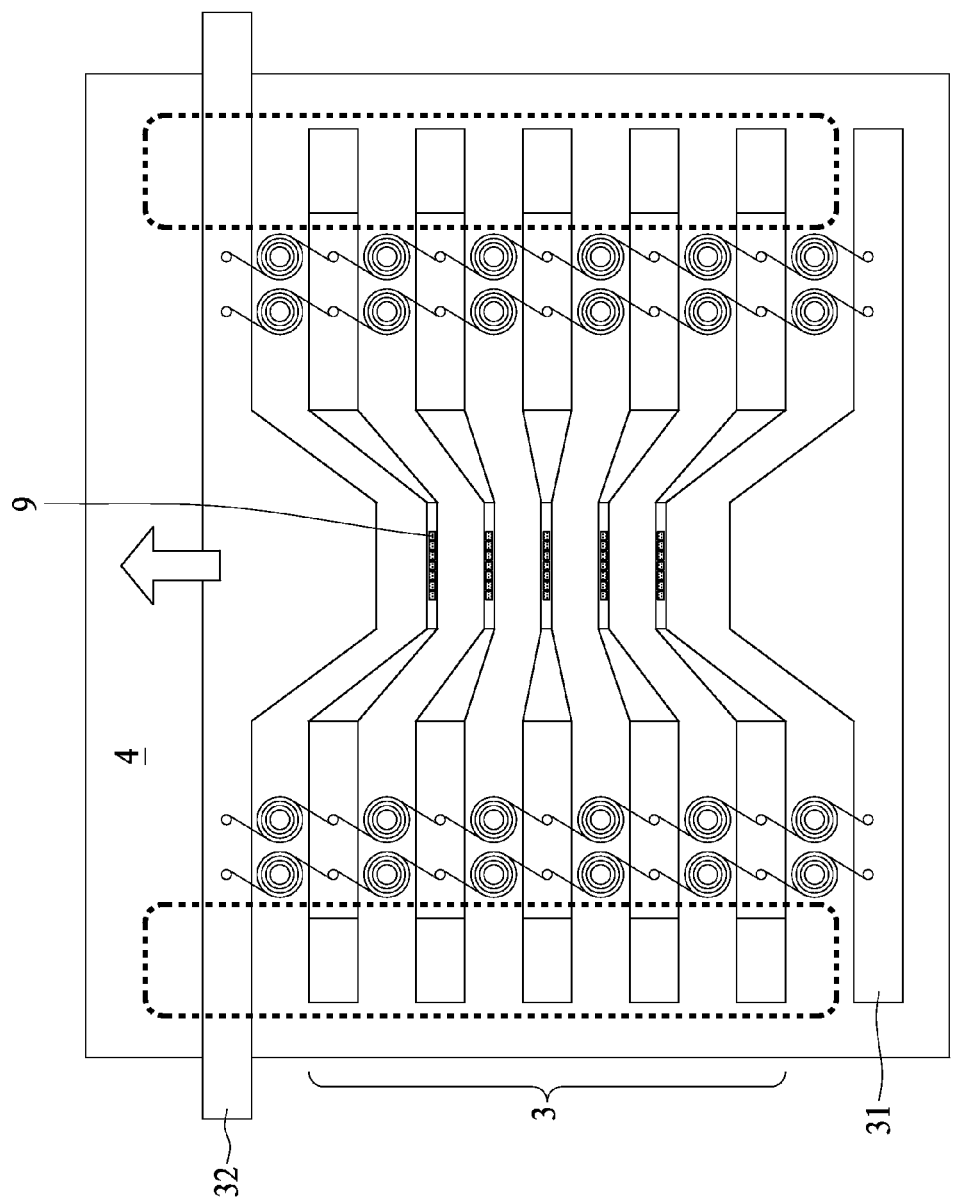
FIGS. 6A and 6B are diagrams illustrating a method of batch assembly according to still another embodiment of the present disclosure.
Figure 6B:
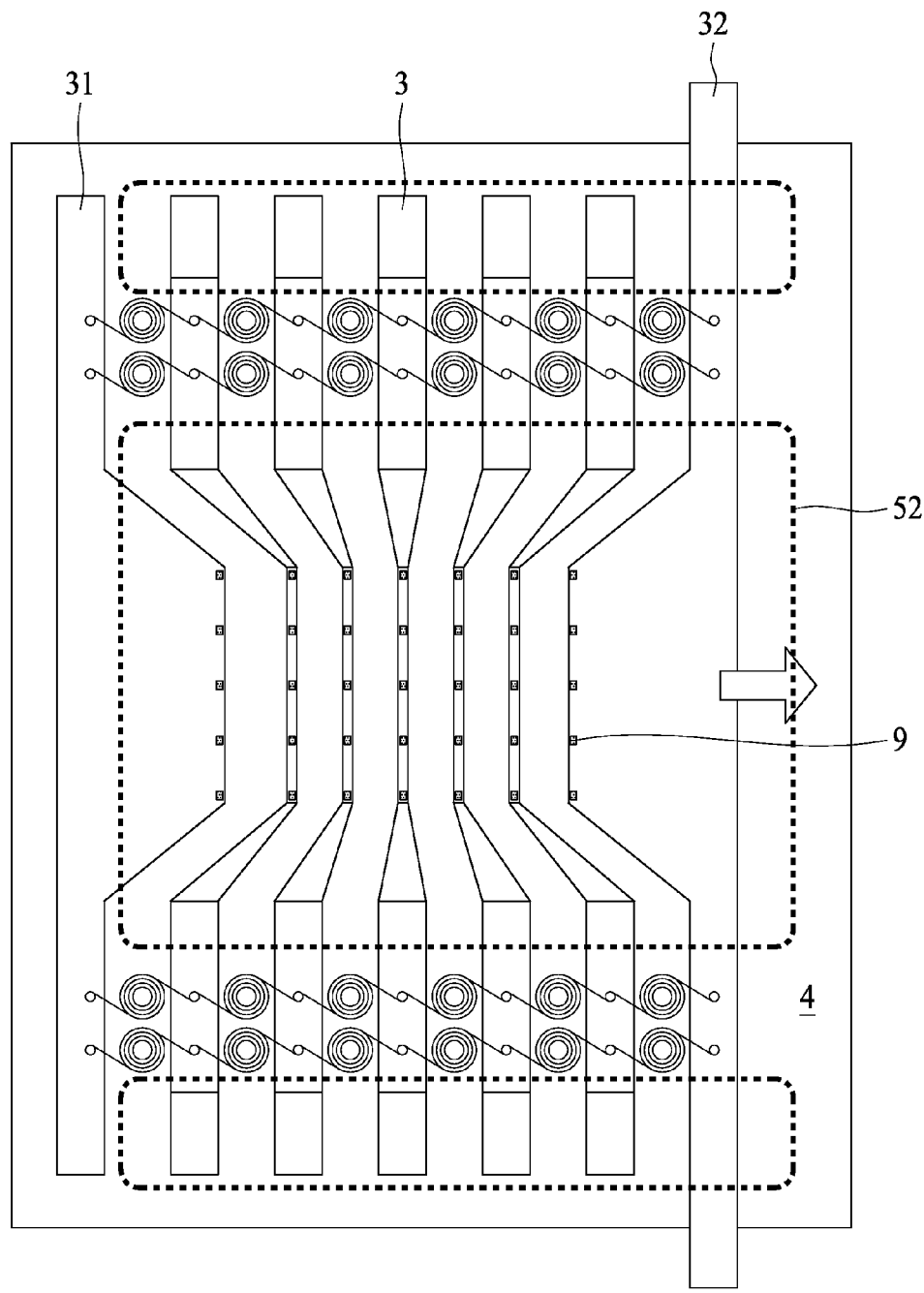

FIGS. 6A and 6B are diagrams illustrating a method of batch assembly according to still another embodiment of the present disclosure. Referring to FIG. 6A, an array of devices 9 are expanded in the first direction from a first area to a second area by a first expanding tool 201, such as the apparatus 100 described and illustrated with reference to FIG. 1. Then the array of devices 9 are released from the handling units 3 of the first expanding tool 201.

Next, referring to FIG. 6B, the array of devices 9 at a half-expanded state are rotated at a desired angle and placed on a second expanding tool 202 similar in structure to the apparatus 100. The array of devices 9 are then expanded in the second direction from the second area to a third area by the second expanding tool 202.

In one embodiment, the first expanding tool 201 or the second expanding tool 202 may individually achieve the expansion of the array of devices 9 from the first area to the third area. For example, a half-expanded device array, after released from the handling units 3 of the first expanding tool 201, may be rotated by, for example, 90 degrees and then further expanded by the first expanding tool 201. Rotation of the half-expanded device array may be performed with the help of a rotator (not shown).

In another embodiment, the first expanding tool 201 and the second expanding tool 202 may be integrated in a system with a rotator to cooperatively expand the array of devices 9.

In still another embodiment, the array of devices 9 may be expanded by the first expanding tool 201 in a direction, and then expanded further by the second expanding tool 202 in the same direction.

Figure 6C:
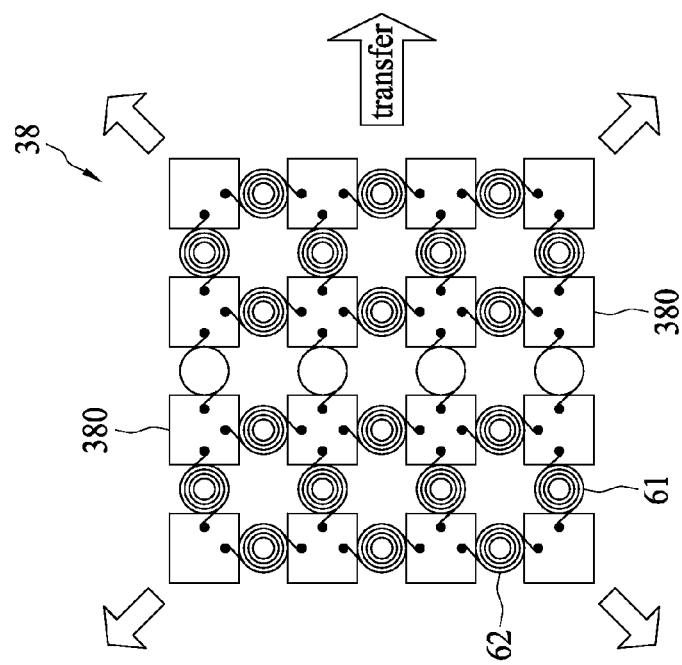
FIG. 6C is a schematic diagram illustrating a method of batch assembly according to yet another embodiment of the present disclosure.
Figure 6C:
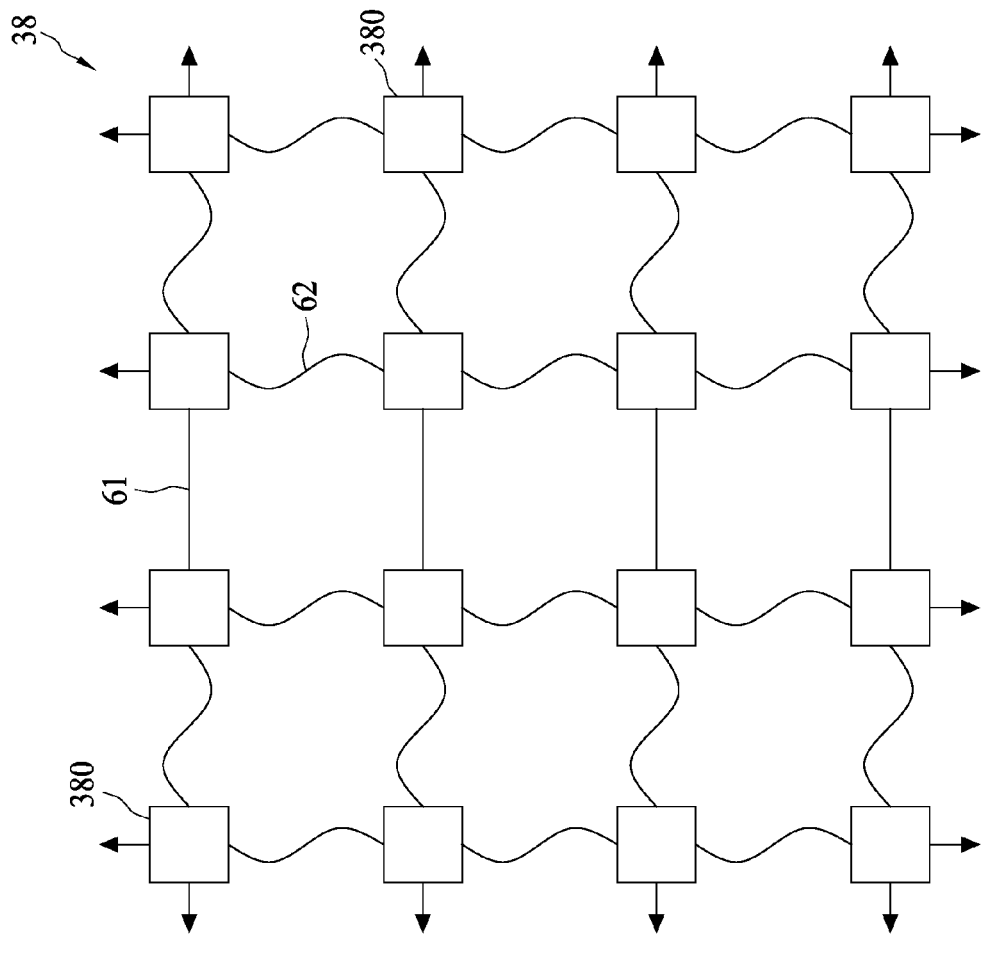

FIG. 6C is a schematic diagram illustrating a method of batch assembly according to yet another embodiment of the present disclosure. Referring to FIG. 6C, an array of devices held on handling units 38 may be expanded to a desired area in one step. Unlike the one-piece handling units 3 illustrated in FIGS. 6A and 6B, each of the handling units 38 at the gripping zone may include discrete portions 380 connected by spring units 61 in the row or second direction to allow a two-dimensional expansion at one time in response to controlled forces shown in arrowheads.

Alternatively, each of the handling units 38 at the gripping zone may include discrete portions connected to discrete portions of another handling unit by spring units 62 in the column or first direction to facilitate the one-step expansion. Furthermore, the spring units 61 and 62 at the gripping zone may have different lengths.

FIG. 6D is a schematic diagram illustrating an expanded state of the handling units 38 according to an embodiment of the present disclosure. Unlike the expanded or half-expanded state shown in FIG. 6C wherein discrete portions 380 are separated by substantially the same distance, at the expanded or half-expanded state shown in FIG. 6D, some discrete portions 380 of the handling units 38 may be separated by a smaller distance. Alternatively, in other embodiments, discrete portions in one row and/or in one column may be separated from one another by different distances.

Figure 6E:
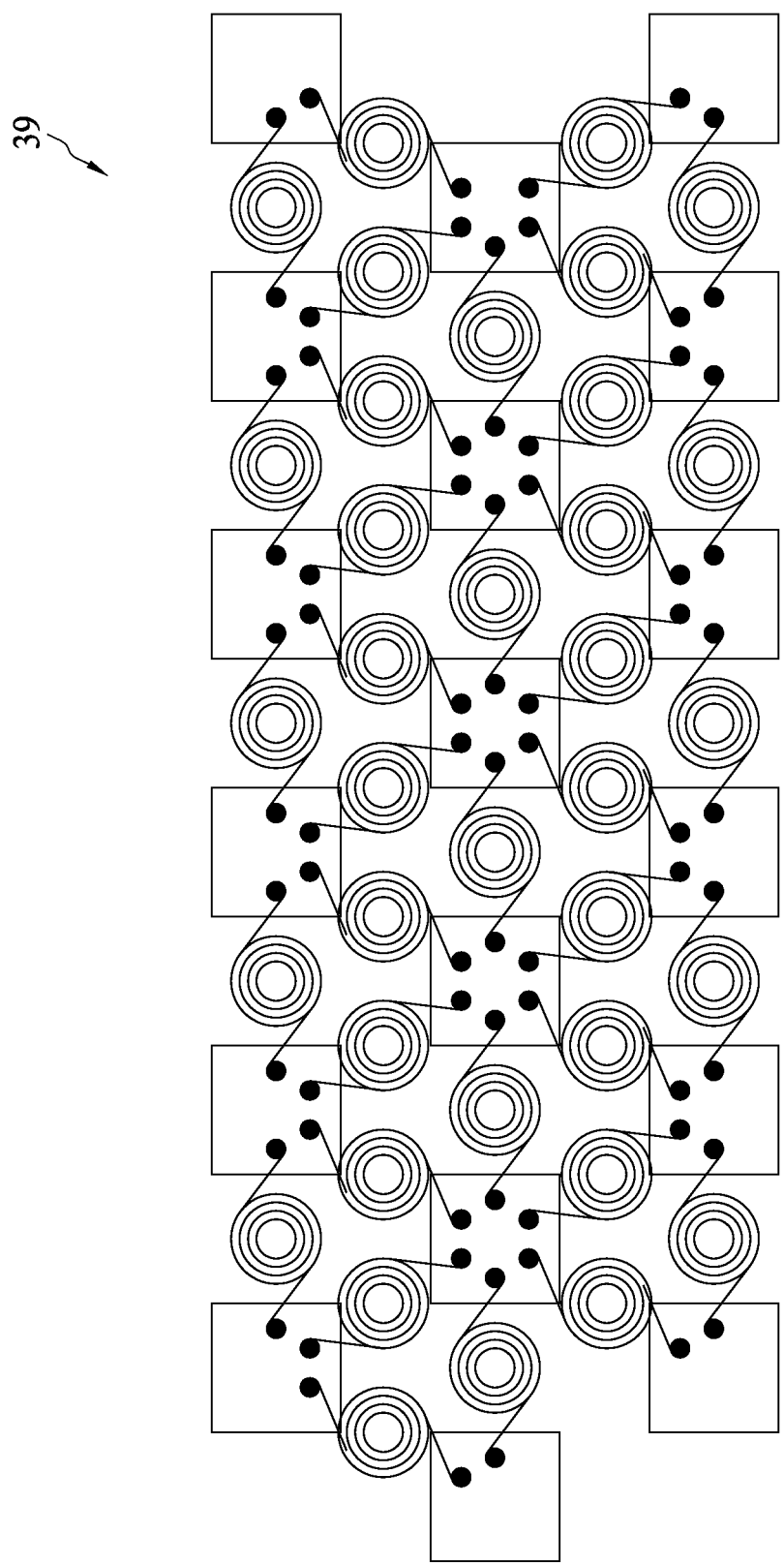
FIG. 6E is a schematic diagram of handling units according to another embodiment of the present disclosure.

FIG. 6E is a schematic diagram of handling units 39 according to another embodiment of the present disclosure. Referring to FIG. 6E, the handling units 39 may be similar to the handling units 38 illustrated and described with reference to FIG. 6C except that, for example, the discrete portions of one handling unit may be staggered with respect to those of another handling unit. Moreover, discrete portions staggered with respect to each other may be connected by spring units.

Figure 7:
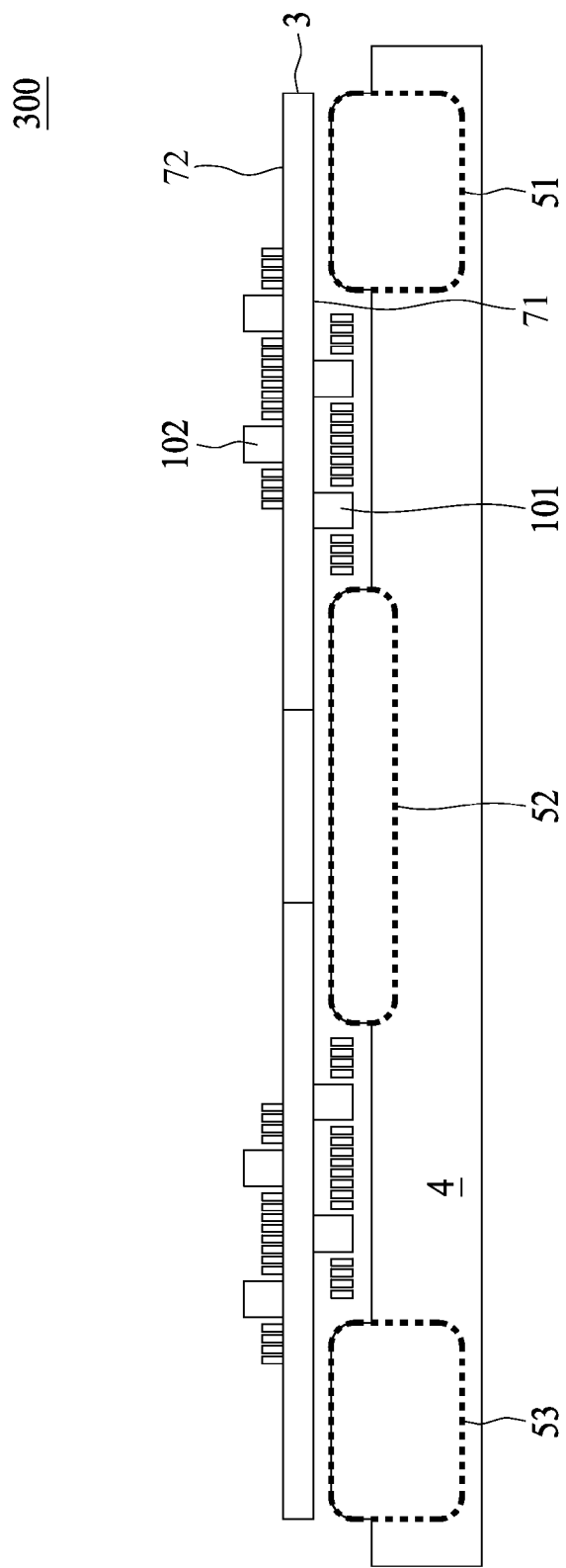
FIG. 7 is a schematic cross-sectional view illustrating an apparatus for batch assembly according to another embodiment of the present disclosure.

FIG. 7 is a schematic cross-sectional view illustrating an apparatus 300 for batch assembly according to another embodiment of the present disclosure. Referring to FIG. 7, the apparatus 300 may be similar to the apparatus 100 described and illustrated with reference to FIG. 1 except that, for example, the apparatus 300 includes a first set of spring units 101 arranged in a first layer on a first surface 71 of the handling units 3, and a second set of spring units 102 arranged in a second layer on a second surface 72 of the handling units 3. The first layer and the second layer are arranged in a stack.

Figure 8:
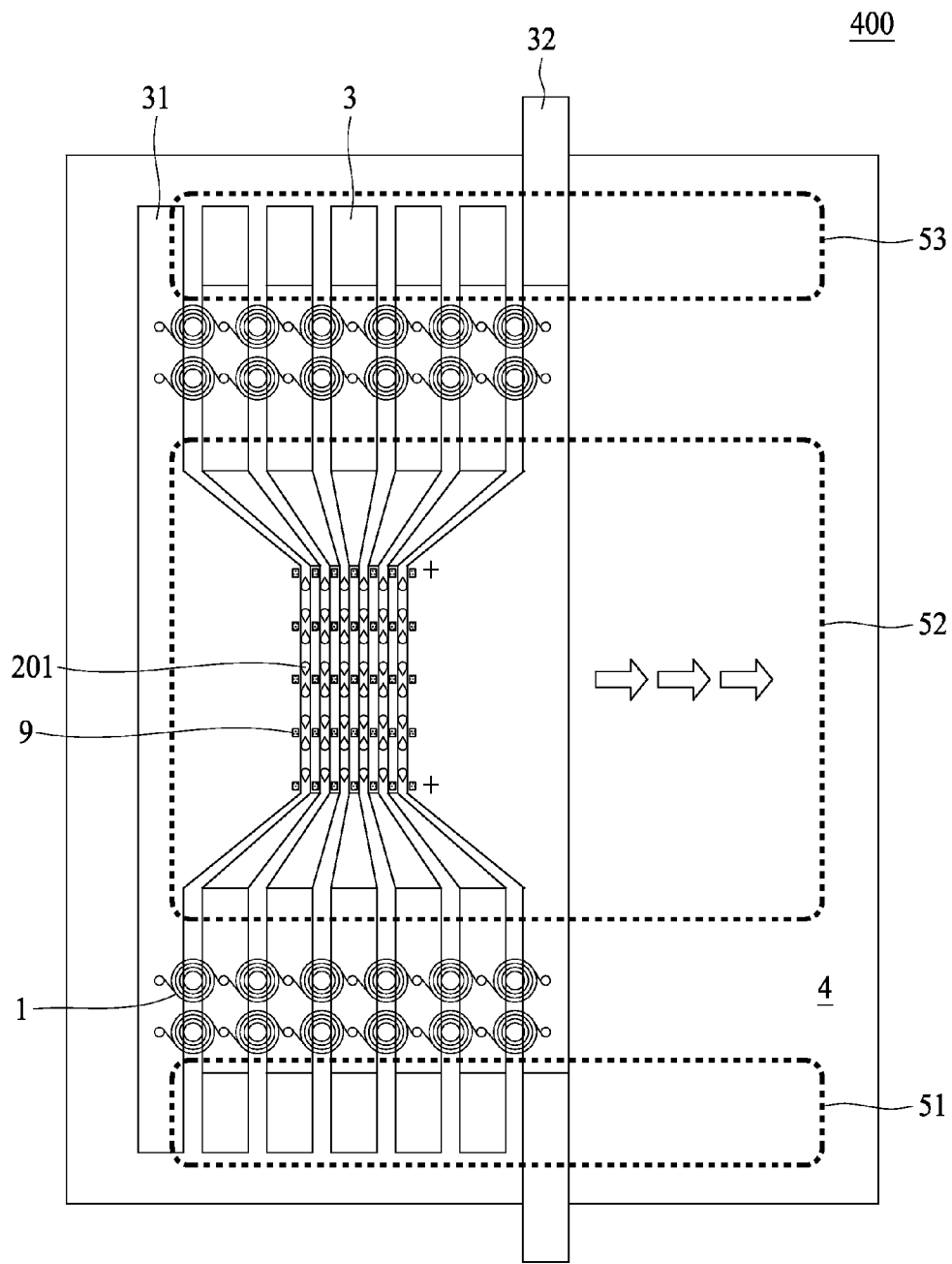
FIG. 8 is a schematic top view illustrating an apparatus for batch assembly according to yet another embodiment of the present disclosure.

FIG. 8 is a schematic top view illustrating an apparatus 400 for batch assembly according to yet another embodiment of the present disclosure. Referring to FIG. 8, the apparatus 400 may be similar to the apparatus 100 described and illustrated with reference to FIG. 1 except that, for example, the apparatus 400 further includes stabilizing elements 201 between the handling units 3 at the gripping zone 8. In one embodiment, the stabilizing elements 201 may include microelectromechanical systems (MEMS) elements. The stabilizing elements 201 may function to enhance the stability of the handling units 3 in relatively large area expansion and facilitate a precise device deployment. The stabilizing elements 201 may be arranged between the devices 9.

Figure 9A:
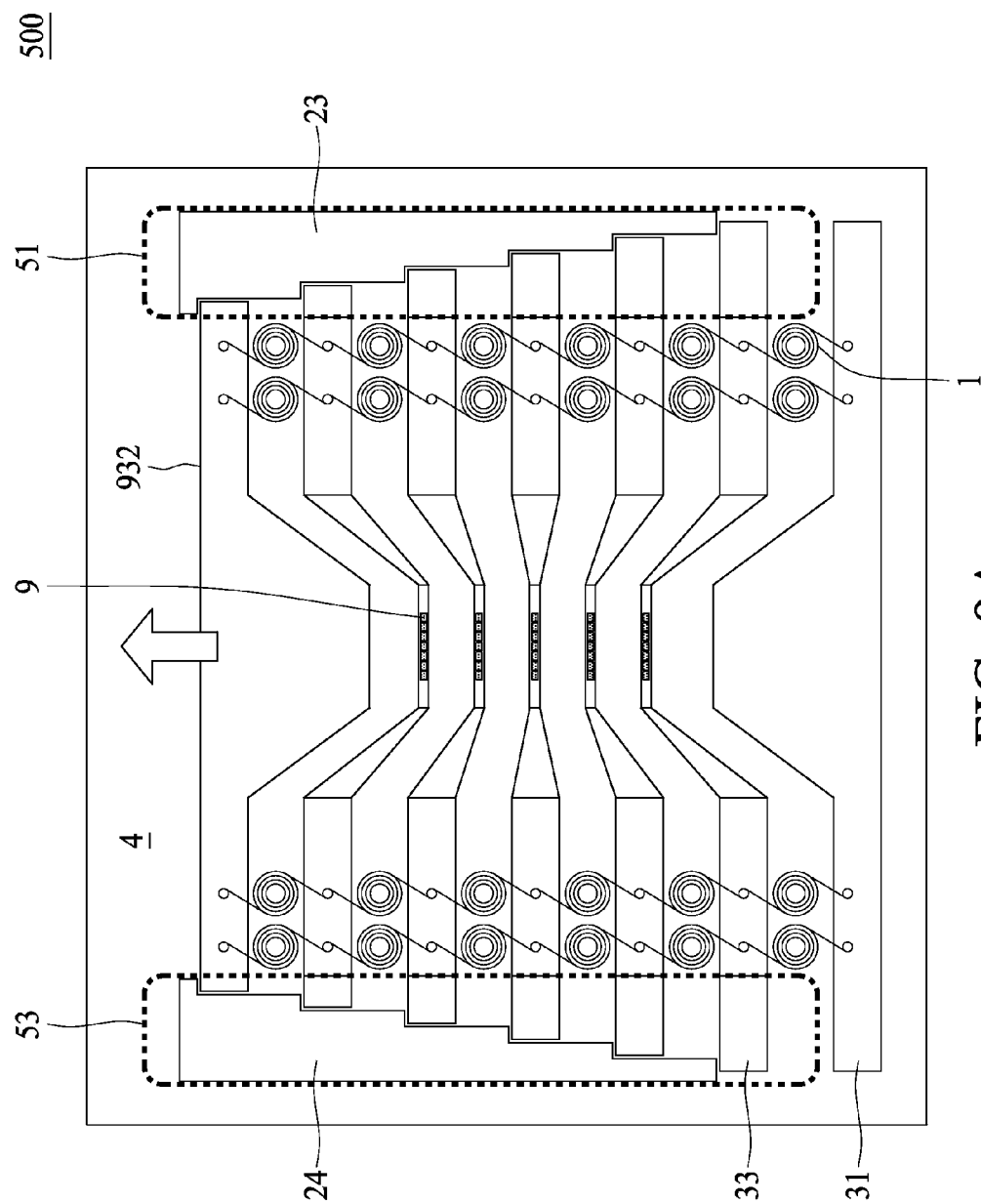
FIG. 9A is a schematic top view illustrating an apparatus for batch assembly according to still another embodiment of the present disclosure.

FIG. 9A is a schematic top view illustrating an apparatus 500 for batch assembly according to still another embodiment of the present disclosure. Referring to FIG. 9A, the apparatus 500 may be similar to the apparatus 100 described and illustrated with reference to FIG. 1 except that, for example, the apparatus 500 includes at least one of a first positioning mechanism 23 or a second positioning mechanism 24 for accurate positioning of handling units 33. The first positioning mechanism 23 may be disposed over the first motion controller 51 and may include a multi-step structure with a flight of steps ascending towards a lead 932. Moreover, the first sections of the handling units 33 over the first motion controller 51 may be configured in length to match the first positioning mechanism 23 and descend towards the lead 932 so as to operate in conjunction with the first positioning mechanism 23. Specifically, each of the steps of the first positioning mechanism 23 may be designed with a tread depth to allow a corresponding handling unit 33 to extend for a distance of the depth, and designed with a riser height to block the corresponding handling unit 33 during expansion.

Likewise, the second positioning mechanism 24 may be disposed over the third motion controller 53 and may include a multi-step structure with a flight of steps ascending towards the lead 932. Moreover, the first sections of the handling units 33 over the third motion controller 53 may be configured in length to match the second positioning mechanism 24 and descend towards the lead 932 so as to operate in conjunction with the second positioning mechanism 24. Specifically, each of the steps of the second positioning mechanism 24 may be designed with a tread depth to allow a corresponding handling unit 33 to extend for a distance of the depth, and designed with a riser height to block the corresponding handling unit 33 during expansion. As such, the handling units 33 may move and hence the array of devices 9 may expand to a desired position.

Figure 9B:
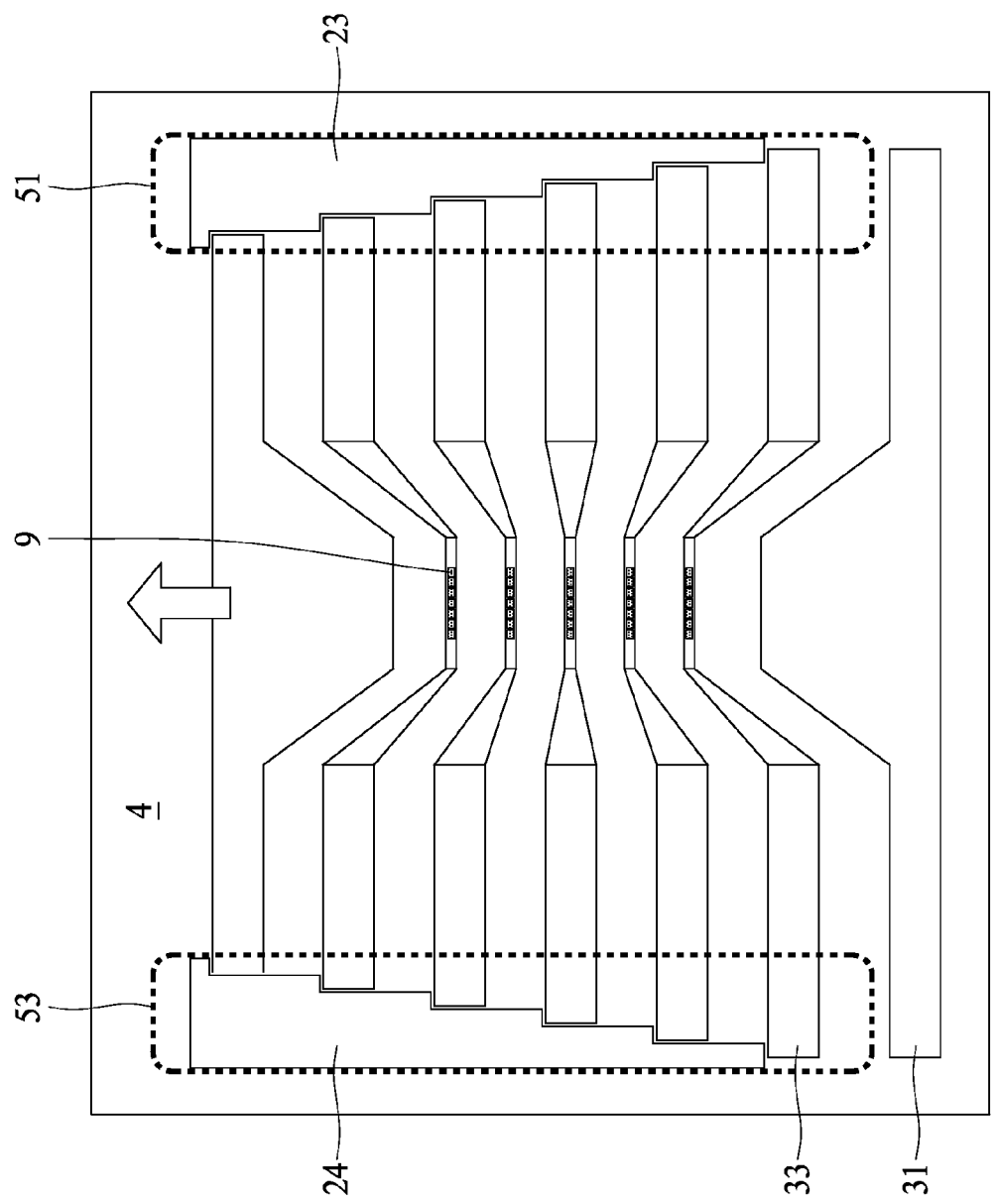
FIG. 9B is a schematic top view illustrating an apparatus for batch assembly according to yet another embodiment of the present disclosure.

FIG. 9B is a schematic top view illustrating an apparatus 501 for batch assembly according to yet another embodiment of the present disclosure. Referring to FIG. 9B, the apparatus 501 may be similar to the apparatus 500 described and illustrated with reference to FIG. 9A except that the apparatus 501, at least at the first sections of the handling units 33 for example, is free from spring units. Positioning of the handling units 33 may be achieved by at least one of the first positioning mechanism 23 or the second positioning mechanism 24. Furthermore, the movement of the handling units 33 in one embodiment may be controlled under at least one of the motion controller 51, 52 or 53. In other embodiments, the movement of the handling units 33 may be done by flipping and/or tilting the apparatus 501 using gravity, or by using a magnetic force or other suitable action-at-a-distance forces.

Figure 10:
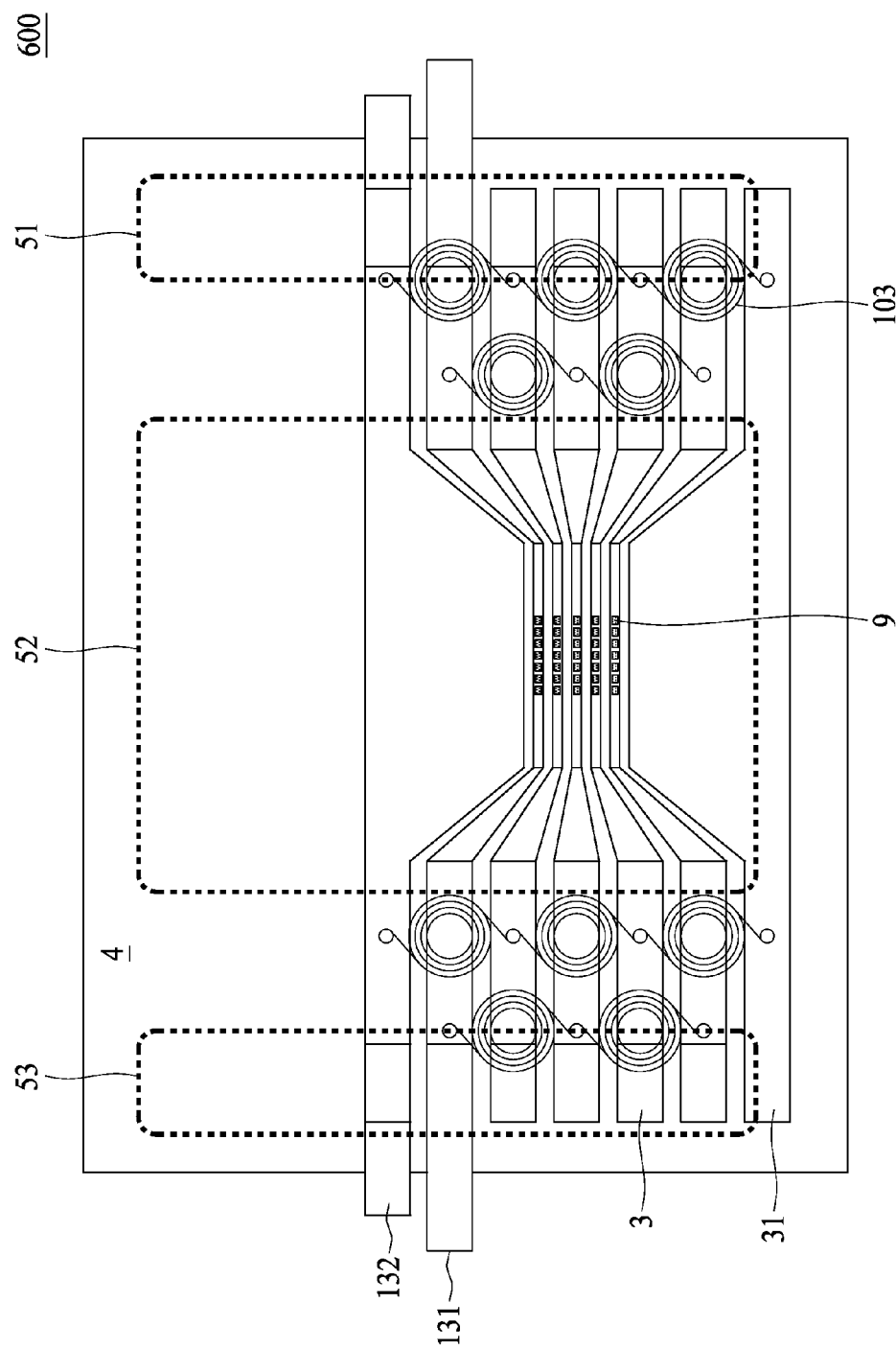
FIG. 10 is a schematic top view illustrating an apparatus for batch assembly according to yet still another embodiment of the present disclosure.

FIG. 10 is a schematic top view illustrating an apparatus 600 for batch assembly according to yet still another embodiment of the present disclosure. Referring to FIG. 10, the apparatus 600 may be similar to the apparatus 100 described and illustrated with reference to FIG. 1 except that, for example, the apparatus 600 includes spring units 103 having a different scheme of connection. Specifically, at least one of the spring units 103 may be connected to two handling units 3 separated by at least one handling unit 3. By comparison, in FIG. 1 for example, each spring unit 1 is connected to two immediately adjacent handling units 3.

In the present embodiment, some of the spring units 103 may be connected to odd-numbered handling units 3, while others may be connected to even-numbered handling units 3. In this way, a first column of spring units 103 and a second column of spring units 103 may be arranged in a staggered manner. Moreover, the apparatus 600 may include a first lead 131 responsible for the first column of spring units and a second lead 132 responsible for the second column of spring units.

Figure 11A:
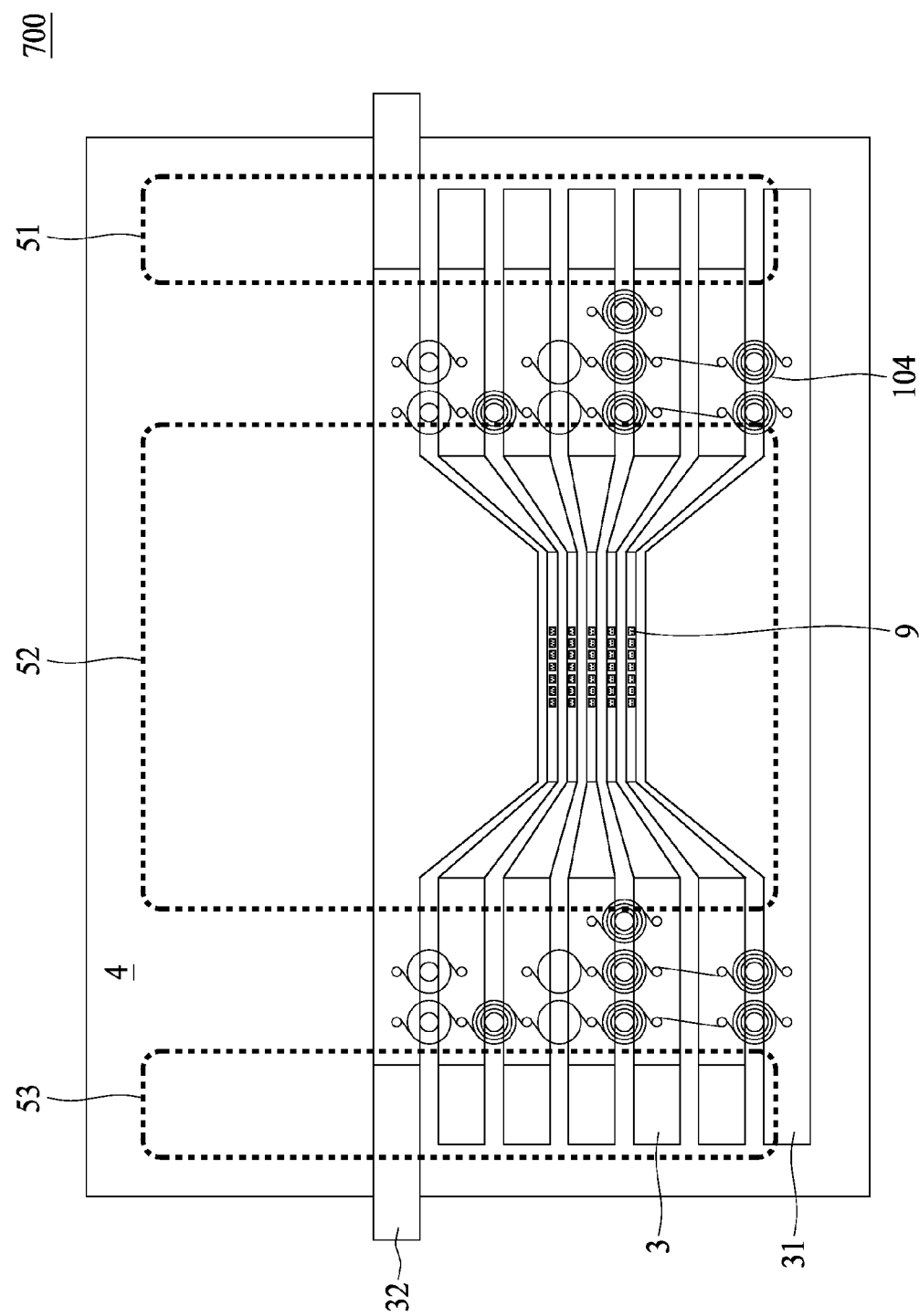
FIGS. 11A and 11B are schematic top views illustrating an apparatus for batch assembly according to still another embodiment of the present disclosure.
Figure 11B:
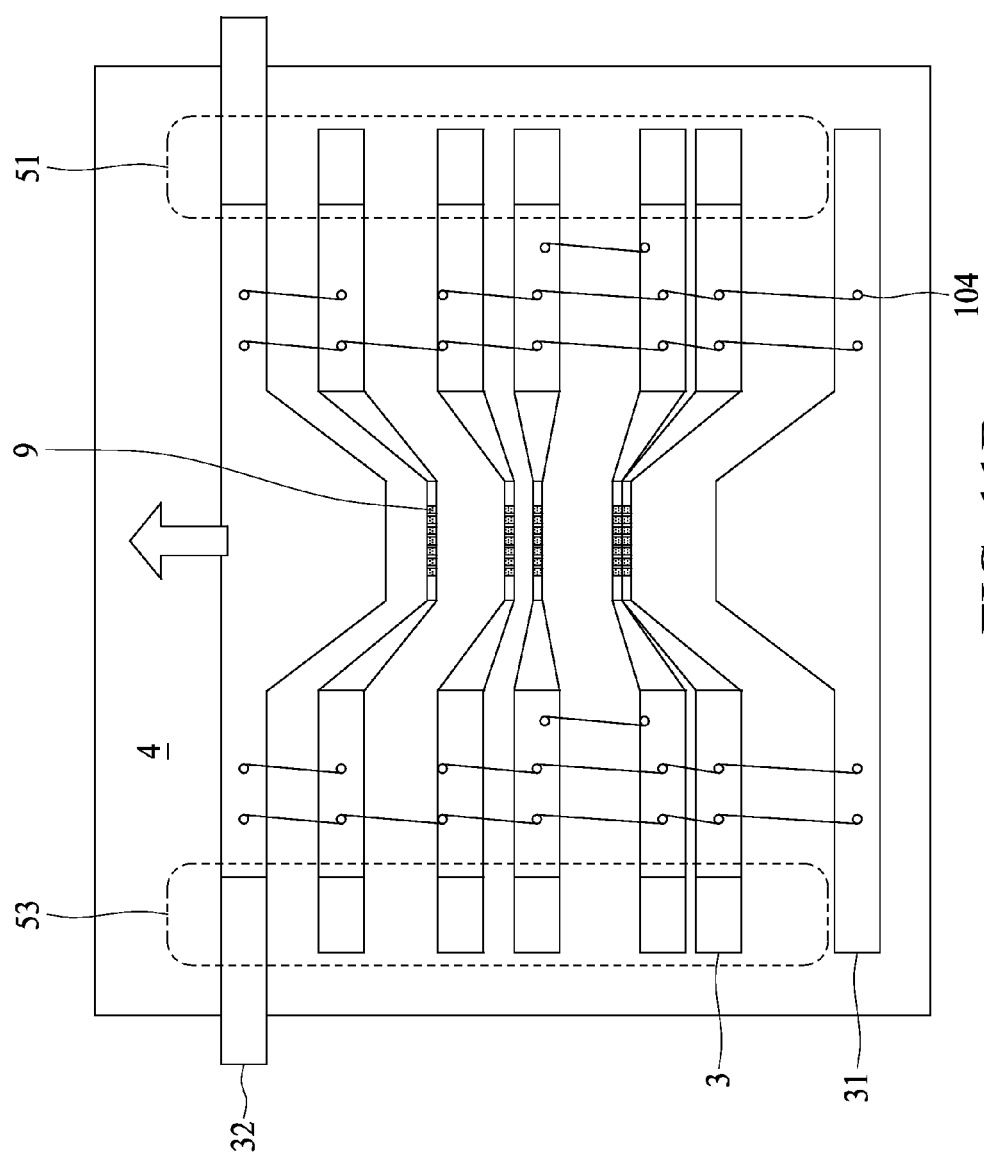

FIGS. 11A and 11B are schematic top views illustrating an apparatus 700 for batch assembly according to still another embodiment of the present disclosure. Referring to FIG. 11A, the apparatus 700 may be similar to the apparatus 100 described and illustrated with reference to FIG. 1 except that, for example, the apparatus 700 has an inhomogeneous distribution of spring units 104. Specifically, at least one column of spring units 104 may include spring units of different lengths. Spring units of different lengths result in an inhomogeneous device density after expanding. That is, at least one row of devices in an array is separated from adjacent rows by different distances.

Referring to FIG. 11B, the distance between adjacent rows of devices 9 may vary due to inhomogeneous distribution of the spring units 104.

Figure 12A:
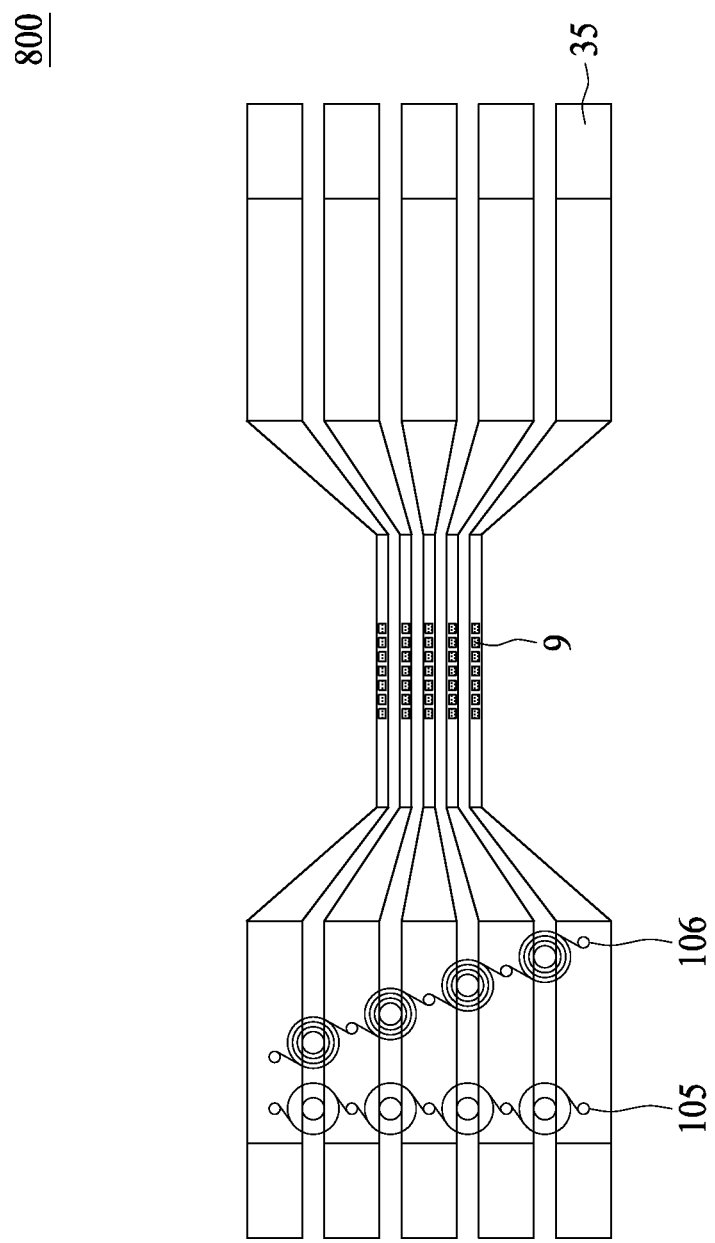
FIGS. 12A and 12B are schematic top views illustrating an apparatus for batch assembly according to a further embodiment of the present disclosure.
Figure 12B:
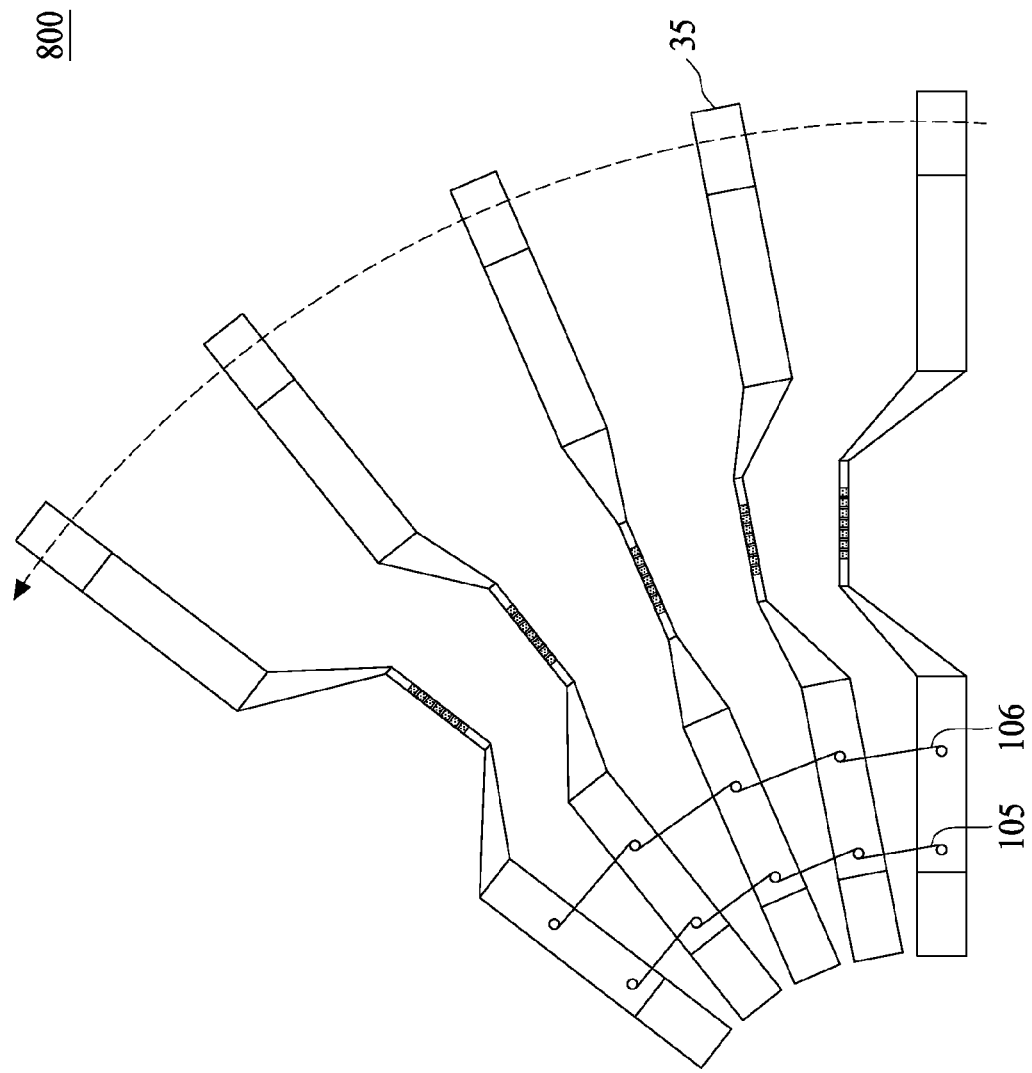

FIGS. 12A and 12B are schematic top views illustrating an apparatus 800 for batch assembly according to a further embodiment of the present disclosure. Referring to FIG. 12A, the apparatus 800 may be similar to the apparatus 100 described and illustrated with reference to FIG. 1 except that, for example, the apparatus 800 has an asymmetric distribution of spring units. Specifically, a first set of spring units 105 are arranged at one side, i.e., a first side, of the handling units 35 in a first direction, and a second set of spring units 106 are arranged at the first side of the handling units 35 in a second direction transverse to the first direction. Moreover, spring units are absent at the other side, i.e., a second side, of the handling units 35.

Referring to FIG. 12B, as the handling units 35 move, the second side without any spring units moves faster than the first side. Accordingly, the handling units 35 may revolve around a pivot point (not shown) near the first side.

Figure 13:
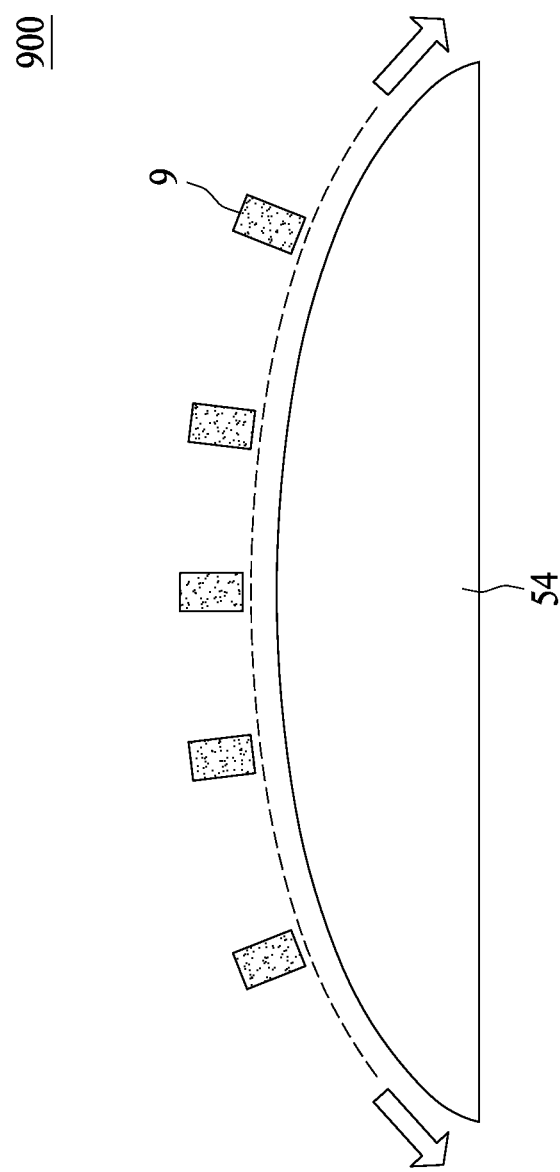
FIG. 13 is a schematic diagram illustrating an apparatus for batch assembly according to a still further embodiment of the present disclosure.

FIG. 13 is a schematic diagram illustrating an apparatus 900 for batch assembly according to a still further embodiment of the present disclosure. Referring to FIG. 13, the apparatus 900 may be similar to the apparatus 100 described and illustrated with reference to FIG. 1 except that, for example, the apparatus 900 includes a motion controller 54 having a curved surface. During device deployment, the spring units 1 and handling units 3 move along the curve surface of the motion controller 54 so as to expand the array of devices 9 to a curved space. The motion controller 54 with a curved surface may facilitate the transfer of an array of devices to a substrate having a non-planar surface.

Although the present disclosure and its advantages have been described in detail, it should be understood that various changes, substitutions, and alterations could be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods, and/or steps described in the specification. As one of ordinary skill in the art will readily appreciate from the disclosure of the present processes, machines, manufacture, compositions of matter, means, methods, and/or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and/or steps.

What is claimed is:

1. An apparatus for batch assembly, comprising:
   a plurality of handling units configured for holding an array of devices; and
   a plurality of spring units connected to the plurality of handling units, wherein the plurality of spring units includes a plurality of springs,
   wherein each handling unit of the plurality of handling units includes a first section, and a second section extending from the first section, wherein the plurality of springs are connected between first sections of the plurality of handling units, wherein each first section of the plurality of handling units is freely suspended and separate from each other first section of the plurality of handling units, wherein the second sections of the plurality of handling units define at least in part a gripping zone, and wherein the plurality of handling units are configured for holding the array of devices only in the gripping zone,
   wherein the plurality of spring units is configured to expand the plurality of handling units along a first direction to thereby expand the array of devices held by the plurality of handling units along the first direction from a first area to a second area greater than the first area.

2. The apparatus according to claim 1, wherein at least one of the spring units is directly connected to at least two adjacent handling units.

3. The apparatus according to claim 1, wherein at least one of the spring units is directly connected to two handling units, wherein the two handling units are separated by at least one other handling unit.

4. The apparatus according to claim 1 further comprising a control unit including at least one motion controller to control the movement of the handling units.

5. The apparatus according to claim 4, wherein one or more of the at least one motion controller has a curved surface such that the handling units of the plurality of handling units are configured to move along the curved surface to expand the array of devices to a non-planar surface corresponding to the curved surface.

6. The apparatus according to claim 4, wherein at least one of the control unit, the plurality of handling units, or the plurality of spring units is configured to provide at least one of electrical or chemical functions for testing the devices.

7. The apparatus according to claim 1, wherein the spring units are arranged in columns, wherein at least one of the columns includes spring units of different lengths.

8. The apparatus according to claim 7, wherein a first one of the columns extends in a first direction, and a second one of the columns extends in a second direction transverse to the first direction.

9. The apparatus according to claim 7, wherein the spring units in a first one of the columns are connected to a first set of handling units, and the spring units in a second one of the columns is connected to a second set of handling units, wherein the first set of handling units and the second set of handling units are different.

10. The apparatus according to claim 1, wherein the spring units are arranged in a first direction, the first sections extend in a second direction different from the first direction, and the second sections are tapered from the first sections towards the gripping zone.

11. The apparatus according to claim 1 further comprising an anchor and a lead, wherein the lead is movable with respect to the anchor, and wherein the anchor is connected to a first handling unit by a first spring unit and the lead is connected to a second handling unit by a second spring unit.

12. The apparatus according to claim 1 further comprising stabilizing elements between the handling units in the gripping zone, wherein the stabilizing elements include microelectromechanical elements.

13. The apparatus according to claim 1 further comprising at least one positioning mechanism including a multi-step structure.

14. The apparatus according to claim 13, wherein the multi-step structure includes a flight of steps ascending in one direction, and the handling units include sections configured in length to match the multi-step structure when expanded along the first direction.

15. The apparatus according to claim 1, wherein the spring units are arranged in a first layer at a first side of the handling units, further comprising spring units arranged in a second layer at a second side of the handling units, the first layer and the second layer being arranged in a stack.

16. The apparatus according to claim 1, wherein the plurality of springs are formed from at least one of crystalline silicon (C—Si), poly silicon, amorphous silicon, piezoelectric material, light-emitting material, transducer material, dielectric, polydimethylsiloxane (PDMS), polymers, materials grown by self-assembly, materials formed by direct growth techniques, CVD fabricated materials, PVD fabricated materials, thermally grown materials, or epitaxially grown materials.

17. The apparatus according to claim 1, wherein the handling units are configured for holding the array of devices using magnetic force, Van der Waals's force, electro static force, surface treatment, or surface tension.

18. The apparatus according to claim 1, wherein each handling unit of the plurality of handling units includes the second section extending between opposing first sections, and wherein the second sections of the plurality of handling units define at least in part the gripping zone located at a center region of the plurality of handling units.

19. The apparatus according to claim 1, wherein each handling unit of the plurality of handling units is separate from each other handling unit except for the plurality of spring units connected to the plurality of handling units.

20. The apparatus according to claim 1, wherein the springs include coils wound in a spiral shape arranged in a planar layer, and wherein the springs are configured to expand along the first direction, wherein the first direction is parallel to the planar layer of the spiral shaped coils of the springs.

21. The apparatus according to claim 20, wherein the first direction is in the same planar layer as the planar layer of the spiral shaped coils of the springs.

22. An apparatus for batch assembly, comprising:
at least one positioning mechanism including a multi-step structure;
a plurality of handling units configured for holding an array of devices, the handling units being configured in length to match the at least one positioning mechanism; and
a plurality of spring units connected to the plurality of handling units, wherein the plurality of spring units includes a plurality of springs,
wherein each handling unit of the plurality of handling units includes a first section, and a second section extending from the first section, wherein the plurality of springs are connected between first sections of the plurality of handling units, wherein each first section of the plurality of handling units is freely suspended and separate from each other first section of the plurality of handling units, wherein the second sections of the plurality of handling units define at least in part a gripping zone, and wherein the plurality of handling units are configured for holding the array of devices only in the gripping zone,
wherein the plurality of spring units is configured to expand the plurality of handling units along a first direction to thereby expand the array of devices held by the plurality of handling units along the first direction from a first area to a second area greater than the first area.

23. The apparatus according to claim 22, wherein the multi-step structure includes a flight of steps ascending in a direction, and the first sections of the handling units descend in the direction.

24. The apparatus according to claim 22 wherein at least one of the spring units is directly connected to at least two adjacent handling units.

25. The apparatus according to claim 22 further comprising a control unit including at least one motion controller to control the movement of the handling units.

26. The apparatus according to claim 25, wherein at least one of the control unit, the plurality of handling units, or the plurality of spring units is configured to test the devices.

27. A method of batch assembly, the method comprising:
aligning an array of semiconductor, electronic, and/or magnetic devices with a plurality of handling units of a first expanding tool, wherein the first expanding tool further includes a plurality of spring units connected to the plurality of handling units, wherein the plurality of spring units includes a plurality of springs, wherein each handling unit of the plurality of handling units includes a first section, and a second section extending from the first section, wherein the plurality of springs are connected between first sections of the plurality of handling units, wherein each first section of the plurality of handling units is freely suspended and separate from each other first section of the plurality of handling units, wherein the second sections of the plurality of handling units define at least in part a gripping zone, and wherein the plurality of handling units are configured for holding the array of devices only in the gripping zone;
attaching the array of devices onto the handling units at the gripping zone; and expanding the handling units along a first direction to thereby expand the array of devices along the first direction from a first area to a second area greater than the first area.

28. The method according to claim 27 further comprising:
removing the array of devices from the handling units;
rotating the array of devices at an angle;
attaching the array of devices onto the handling units; and
expanding the handling units to expand the array of devices from the second area to a third area.

29. The method according to claim 27, wherein expanding the handling units includes expanding the handling units in a first direction, and further comprising:
providing a second expanding tool;
removing the array of devices from the handling units of the first expanding tool;
attaching the array of devices onto handling units of the second expanding tool; and
expanding the array of devices in a second direction.

30. The method according to claim 27, wherein expanding the handling units further comprises:
expanding the handling units along a curved surface.

31. The method according to claim 27 further comprising providing a plurality of stabilizing elements between the handling units.

32. A method of batch assembly, the method comprising:
providing at least one positioning mechanism including a multi-step structure;
aligning an array of semiconductor, electronic, and/or magnetic devices with a plurality of handling units of an expanding tool, wherein the handling units are configured in length to match the at least one positioning mechanism, wherein the expanding tool further includes a plurality of spring units connected to the plurality of handling units, wherein the plurality of spring units includes a plurality of springs, wherein each handling unit of the plurality of handling units includes a first section, and a second section extending from the first section, wherein the plurality of springs are connected between first sections of the plurality of handling units, wherein each first section of the plurality of handling units is freely suspended and separate from each other first section of the plurality of handling units, wherein the second sections of the plurality of handling units define at least in part a gripping zone, and wherein the plurality of handling units are configured for holding the array of devices only in the gripping zone;
attaching the array of devices onto the handling units at the gripping zone; and
expanding the handling units along a first direction to thereby expand the array of devices along the first direction from a first area to a second area greater than the first area.

* * * * *